United States Patent
Tashiro et al.

(10) Patent No.: US 10,446,594 B2
(45) Date of Patent: Oct. 15, 2019

(54) IMAGE PICKUP DEVICE AND IMAGE PICKUP SYSTEM

(71) Applicant: CANON KABUSHIKI KAISHA, Tokyo (JP)

(72) Inventors: Kazuaki Tashiro, Isehara (JP); Tatsuhito Goden, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/364,072

(22) Filed: Nov. 29, 2016

(65) Prior Publication Data

US 2017/0162616 A1    Jun. 8, 2017

(30) Foreign Application Priority Data

Dec. 4, 2015 (JP) ................................ 2015-237867

(51) Int. Cl.
*H01L 27/146* (2006.01)
*H04N 5/378* (2011.01)

(52) U.S. Cl.
CPC .... *H01L 27/14605* (2013.01); *H01L 27/1464* (2013.01); *H01L 27/14609* (2013.01); *H01L 27/14621* (2013.01); *H01L 27/14623* (2013.01); *H01L 27/14627* (2013.01); *H01L 27/14636* (2013.01); *H01L 27/14645* (2013.01); *H04N 5/378* (2013.01); *H01L 27/14659* (2013.01)

(58) Field of Classification Search
CPC ........ H01L 27/14605; H01L 27/14609; H01L 27/14623; H01L 27/14627; H01L 27/14665

USPC .............................................................. 1/22
See application file for complete search history.

(56) References Cited

U.S. PATENT DOCUMENTS

| | | | |
|---|---|---|---|
| 7,876,422 B2 | 1/2011 | Hashimoto | |
| 8,901,618 B2 | 12/2014 | Fukuro | |
| 2008/0224053 A1* | 9/2008 | Shen | G01T 1/2018 250/369 |
| 2009/0057659 A1* | 3/2009 | Maehara | H01L 51/4213 257/40 |
| 2010/0140675 A1* | 6/2010 | Rhodes | H01L 27/14601 257/292 |
| 2011/0273601 A1 | 11/2011 | Egawa | |
| 2012/0085888 A1* | 4/2012 | Endo | H01L 27/14609 250/208.1 |
| 2012/0086095 A1 | 4/2012 | Nishiyama | |
| 2013/0256544 A1 | 10/2013 | Michiru | |

(Continued)

FOREIGN PATENT DOCUMENTS

| CN | 102629614 A | 8/2012 |
|---|---|---|
| EP | 2486589 B1 | 12/2014 |

(Continued)

*Primary Examiner* — Phat X Cao
(74) *Attorney, Agent, or Firm* — Canon, U.S.A., Inc. IP Division

(57) ABSTRACT

An image pickup device according to an embodiment includes a substrate on which a plurality of pixel circuits are disposed, a semiconductor layer disposed on the substrate, a first electrode disposed on the semiconductor layer, and a second electrode disposed between the semiconductor layer and the substrate. A continuous portion of the semiconductor layer includes a light receiving region disposed between the first electrode and the second electrode and a charge hold region different from the light receiving region.

40 Claims, 20 Drawing Sheets

(56) References Cited

U.S. PATENT DOCUMENTS

2015/0048473 A1    2/2015   Hirotsugu
2016/0119562 A1*   4/2016   Takase .............. H01L 27/14667
                                                               348/230.1

FOREIGN PATENT DOCUMENTS

| JP | 2016086407 A | 5/2016 |
| --- | --- | --- |
| WO | 2012/004923 A1 | 1/2012 |
| WO | 2013088352 A2 | 6/2013 |
| WO | 2015/068668 A1 | 5/2015 |

* cited by examiner

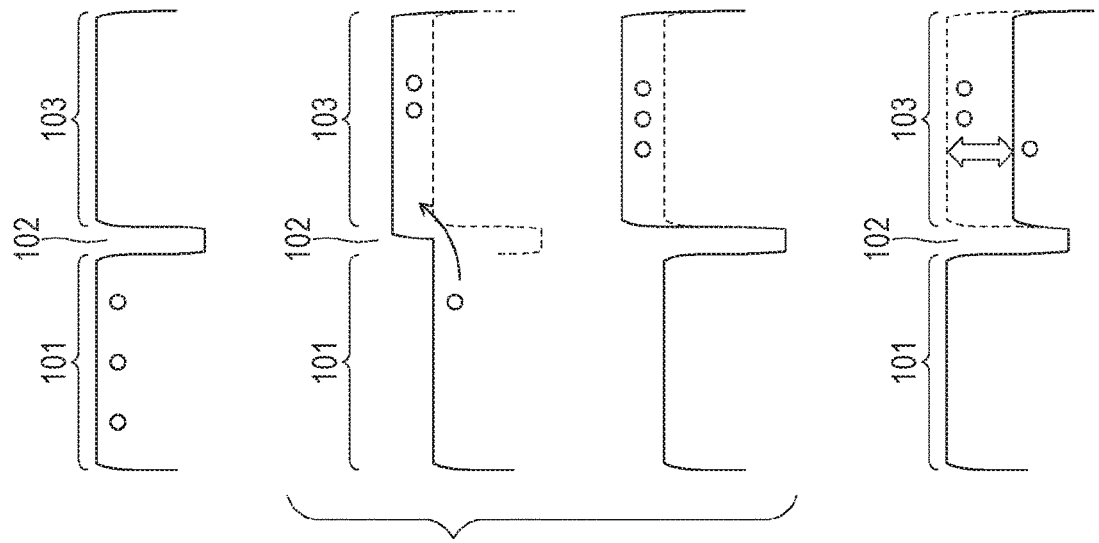
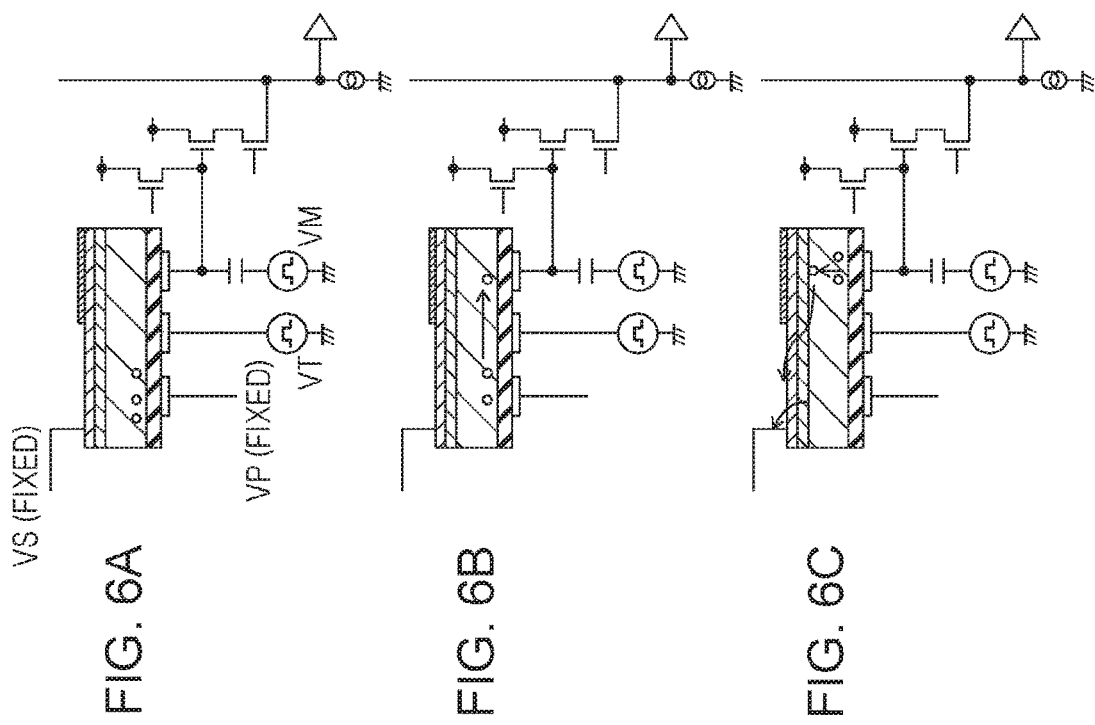

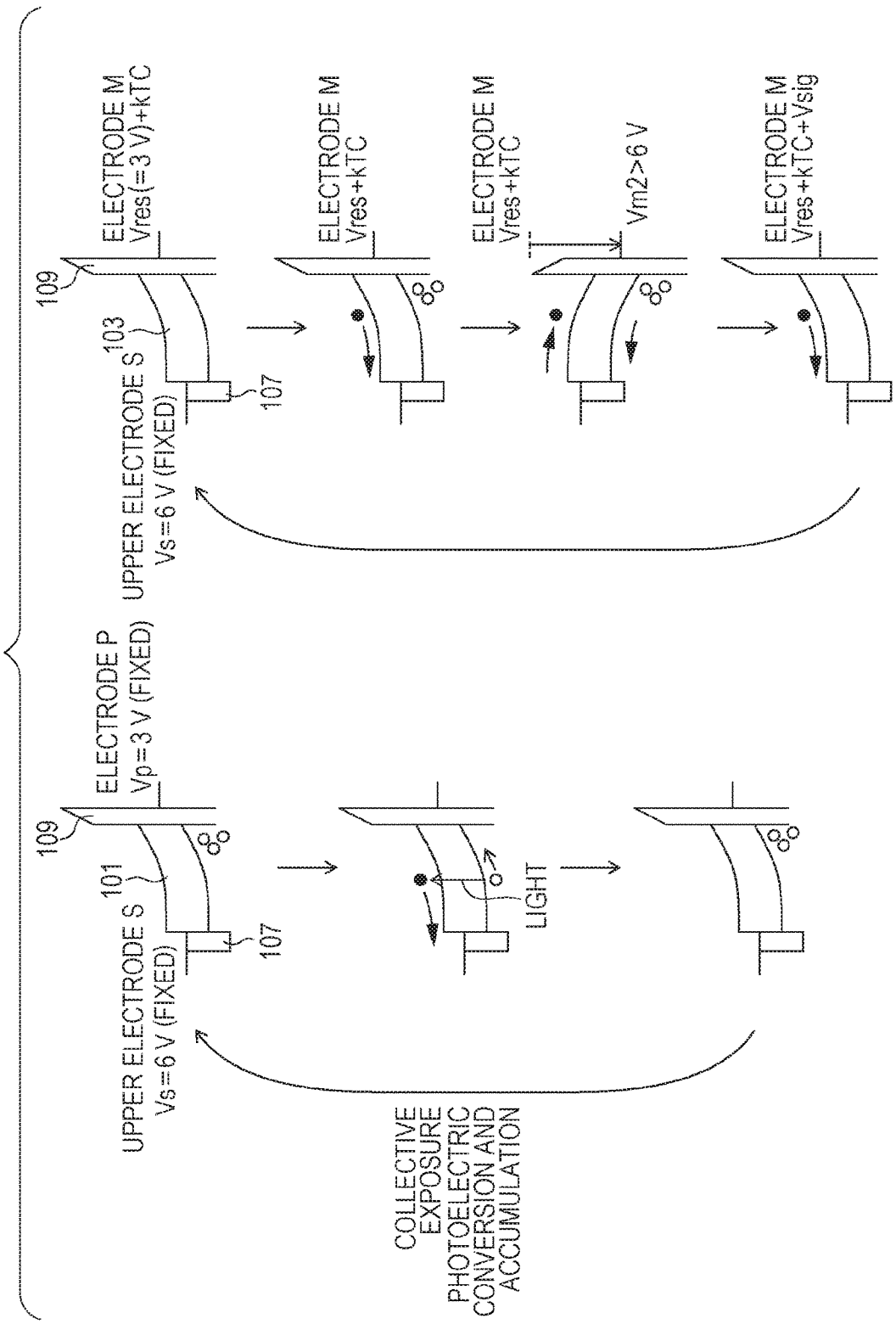

IMAGE PICKUP DEVICE AND IMAGE PICKUP SYSTEM

BACKGROUND OF THE INVENTION

Field of the Invention

The present invention relates to an image pickup device and an image pickup system.

Description of the Related Art

A multilayer image pickup device is suggested as an image pickup device used for an image sensor or the like of a camera. In the image pickup device illustrated in FIG. 1 of WO 2012/004923, a photoelectric conversion film is disposed on a semiconductor substrate. A transparent electrode is disposed on the photoelectric conversion film, and a pixel electrode is disposed between the photoelectric conversion film and the semiconductor substrate. An insulating film is disposed between the photoelectric conversion film and the pixel electrode. According to WO 2012/004923, such a configuration enables correlated double sampling (CDS) and accordingly noise can be reduced.

SUMMARY OF THE INVENTION

An image pickup device according to an embodiment includes a substrate on which a plurality of pixel circuits are disposed, a semiconductor layer disposed on the substrate, a first electrode disposed on the semiconductor layer, and a second electrode disposed between the semiconductor layer and the substrate. A continuous portion of the semiconductor layer includes a light receiving region disposed between the first electrode and the second electrode, and a charge hold region configured to hold a charge generated in the light receiving region, the charge hold region being disposed at a position different from the light receiving region.

An image pickup device according to another embodiment includes a substrate on which a plurality of pixel circuits are disposed, a semiconductor layer disposed on the substrate and including, for each of the plurality of pixel circuits, a first portion configured to receive light and a second portion shielded from light, and a bias voltage supplier configured to apply a bias voltage to the first portion and the second portion independently of each other.

Further features of the present invention will become apparent from the following description of exemplary embodiments with reference to the attached drawings.

BRIEF DESCRIPTION OF THE DRAWINGS

FIGS. 6A to 6C schematically illustrate the configuration of a pixel of the image pickup device, and FIGS. 6D to 6F schematically illustrate a potential of the image pickup device.

FIG. 7 schematically illustrates an energy band of the photoelectric conversion portion of the image pickup device.

DESCRIPTION OF THE EMBODIMENTS

Figure 1A:
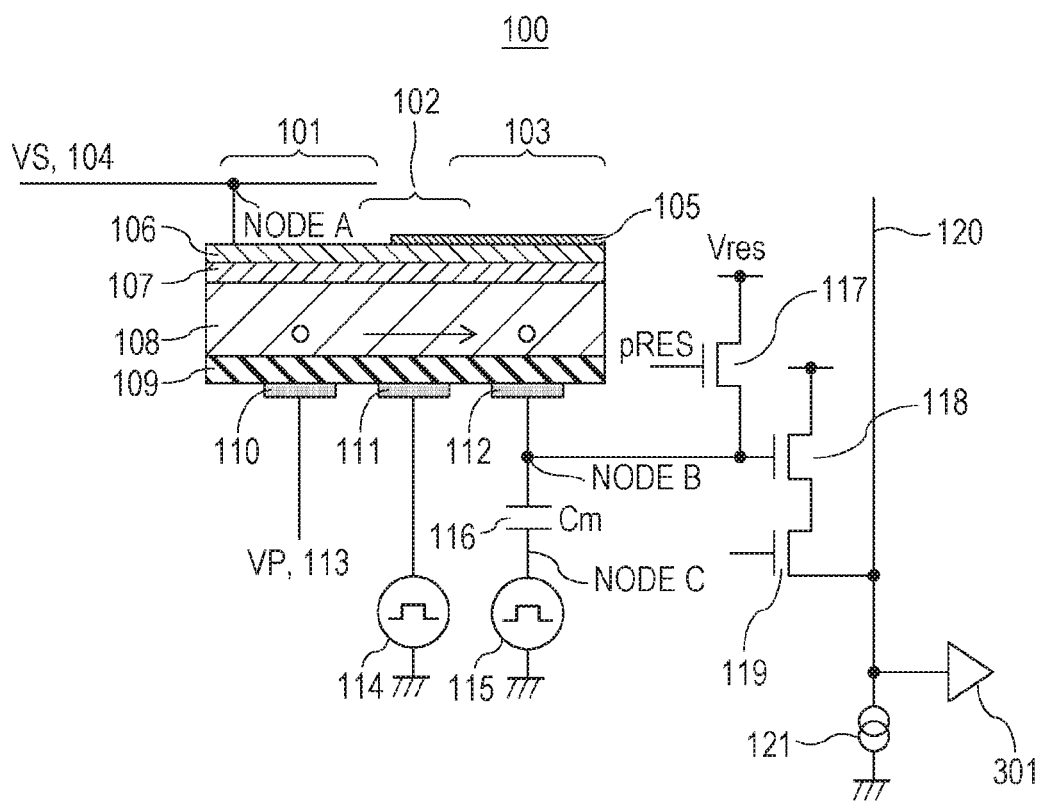
FIG. 1A schematically illustrates the configuration of a pixel of an image pickup device.

For example, in the case of accumulating charges in a plurality of pixels in the same exposure period and then sequentially reading signals from the plurality of pixels, as in a global electronic shutter operation, the accumulated charges or signals based on the charges are held in a place different from a light receiving region. The inventors have conceived of using a node including a pixel electrode disposed under a photoelectric conversion film as a node for holding signals. However, in some image pickup devices, a pixel electrode is connected to a diffusion layer forming the source of a reset transistor and the gate of an amplification transistor. That is, a node including a pixel electrode serves as an input node of an amplification portion. Thus, since signals are held in a place different from a light receiving region, it is difficult to perform CDS if signals are held by a node including a pixel electrode. As a result, noise may increase. In an image pickup device, it is difficult to reduce noise in the case of performing a global electronic shutter operation or the like. According to some embodiments, noise can be reduced.

An embodiment according to the present invention is an image pickup device including a plurality of pixels. Each pixel includes a photoelectric conversion portion and a pixel circuit for reading signals that are based on charges generated by the photoelectric conversion portion. The image pickup device according to this embodiment includes a substrate on which pixel circuits are disposed, and a semiconductor layer disposed on the substrate. A continuous portion of the semiconductor layer includes a light receiving region disposed between a first electrode and a second electrode, and a charge hold region different from the light receiving region.

With the configuration in which the light receiving region and the charge hold region are disposed in the continuous portion of the semiconductor layer, at least one of the following effects can be obtained.

Since the charge hold region is provided in addition to the light receiving region and the pixel circuit, signals that are based on signal charges generated in an exposure period can be held in the charge hold region from when the exposure period ends to when the signals are read. With this configuration, a noise reduction process such as CDS can be easily performed in the case of performing a global electronic shutter operation. As a result, noise can be reduced. The global electronic shutter operation is an example of an operation of accumulating charges in the same exposure period in a plurality of pixels and then sequentially reading signals from the plurality of pixels.

In the semiconductor layer, a technique for reducing dark current can be applied. Thus, the charge hold region is disposed in the semiconductor layer, and accordingly mixing of charges causing noise while signal charges are held can be suppressed. Furthermore, since the light receiving region and the charge hold region are disposed in the continuous portion of the semiconductor layer, noise generated in a signal transmission path from the light receiving region to the charge hold region can be suppressed. The method for causing the charge hold region to hold signals is not particularly limited. For example, signal charges generated in the light receiving region can be transferred to the charge hold region. Alternatively, a potential change in the light receiving region based on signal charges can be transmitted through capacitive coupling.

Since the light receiving region and the charge hold region are disposed in the continuous portion of the semiconductor layer, signal charges can be transferred from the light receiving region to the charge hold region with a simple configuration. For example, charges can be transferred by using a charge transfer region disposed between the light receiving region and the charge hold region and an electrode that applies a bias voltage to the charge transfer region.

Another embodiment according to the present invention is an image pickup device including a plurality of pixels. Each pixel includes a photoelectric conversion portion and a pixel circuit for reading signals that are based on charges generated by the photoelectric conversion portion. The image pickup device according to this embodiment includes a substrate on which pixel circuits are disposed, and a semiconductor layer disposed on the substrate. The semiconductor layer includes a first portion (light receiving region) that receives light, and a second portion (charge hold region) that is shielded from light. The image pickup device further includes a bias voltage supplier configured to apply a bias voltage to the first portion and the second portion independently of each other.

With the configuration including the bias voltage supplier configured to apply a bias voltage to the first portion and the second portion independently of each other, the first portion can be used as the light receiving region and the second portion can be used as the charge hold region. Accordingly, at least one of the following effects can be obtained. The method for causing the charge hold region to hold signals is not particularly limited. For example, signal charges generated in the light receiving region can be transferred to the charge hold region. Alternatively, a potential change in the light receiving region based on signal charges can be transmitted through capacitive coupling.

Since the charge hold region for holding charges is disposed in the semiconductor layer in addition to the light receiving region that receives light, signals that are based on signal charges generated in an exposure period can be held in the charge hold region from when the exposure period ends to when the signals are read. With this configuration, a noise reduction process such as CDS can be easily performed in the case of performing a global electronic shutter operation. As a result, noise can be reduced. The global electronic shutter operation is an example of an operation of accumulating charges in the same exposure period in a plurality of pixels and then sequentially reading signals from the plurality of pixels.

Since the charge hold region is shielded against light, mixing of charges generated through photoelectric conversion while signal charges are held in the charge hold region into the charge hold region can be suppressed. As a result, noise can be reduced.

In the semiconductor layer, a technique for reducing dark current can be applied. Thus, the charge hold region is disposed in the semiconductor layer, and accordingly mixing of charges causing noise while signal charges are held can be suppressed.

According to another embodiment, the first portion may be used as a light receiving region, and the second portion may be used as an optical black (OB) region. Thus, with differential processing being performed on a signal from the light receiving region and a signal from the OB region, noise caused by dark current or the like can be removed.

As a result, an image signal with reduced noise can be obtained.

Hereinafter, embodiments of the present invention will be described in detail with reference to the attached drawings. The present invention is not limited to the embodiments described below. A modification example obtained by changing the configuration of part of any one of the following embodiments without deviating from the gist of the present invention is also an embodiment of the present invention. Also, an example in which the configuration of part of any one of the following embodiments is added to another embodiment, or an example in which the configuration of part of any one of the following embodiments is replaced by the configuration of part of another embodiment is also an embodiment of the present invention.

First Embodiment

An embodiment of the present invention will be described. FIG. 1A schematically illustrates a pixel 100 of an image pickup device according to this embodiment. The image pickup device includes a substrate (not illustrated) on which pixel circuits of pixels 100 are arranged and a semiconductor layer 108 disposed on the substrate. FIG. 1A illustrates only one pixel 100, but the image pickup device according to this embodiment includes a plurality of pixels 100.

The pixel 100 includes a light receiving region 101, a charge transfer region 102, and a charge hold region 103, which are disposed in the semiconductor layer 108. The light receiving region 101 corresponds to a first portion of the semiconductor layer 108, and the charge hold portion 103 corresponds to a second portion of the semiconductor layer 108. The semiconductor layer 108 may be composed of an inorganic semiconductor, such as silicon. Alternatively, the semiconductor layer 108 may be composed of an organic semiconductor.

An upper electrode S 106 is disposed on the semiconductor layer 108. The upper electrode S 106 applies a bias voltage to the light receiving region 101, the charge transfer region 102, and the charge hold region 103. The upper electrode S 106 is connected to a power supply VS 104. The power supply VS 104 supplies a voltage Vs. In this embodiment, the upper electrode S 106 applies a bias voltage to both the light receiving region 101 and the charge hold region 103. For this purpose, the upper electrode S 106 is formed of a conductive layer that continuously extends on the light receiving region 101 and the charge hold region 103. From another point of view, a first portion (first electrode) of the upper electrode S 106 applies a bias voltage to the light receiving region 101, and a second portion (third electrode) of the upper electrode S 106 applies a bias voltage to the charge hold region 103. The first portion (first electrode) and the second portion (third electrode) of the upper electrode S 106 may be isolated from each other.

The pixel 100 further includes an electrode P (second electrode) 110 that applies a bias voltage to the right reception region 101 and a power supply VP 113 connected to the electrode P 110. The power supply VP 113 supplies a voltage Vp. The pixel 100 further includes an electrode M (fourth electrode) 112 that applies a bias voltage to the charge hold region 103. The light receiving region 101 of the semiconductor layer 108 is disposed between the first portion (first electrode) of the upper electrode S 106 and the electrode P 110. The charge hold region 103 of the semiconductor layer 108 is disposed between the second portion (third electrode) of the upper electrode S 106 and the electrode M 112.

The electrode P 110 and the electrode M 112 are electrically isolated from each other. With this configuration, a bias voltage can be applied to the light receiving region 101 and the charge hold region 103 independently of each other. In this embodiment, the electrode P 110 and the electrode M 112 constitute a bias voltage supplier that applies a bias voltage to the light receiving region (first portion) 101 and the charge hold region (second portion) 103 of the semiconductor layer 108 independently of each other. In a case where a bias voltage is not applied to the light receiving region 101 and the charge hold region 103 independently of each other, the electrode P 110 and the electrode M 112 may be continuous. In a case where a bias voltage is not applied to the charge hold region 103, the electrode M 112 may be omitted.

The upper electrode S 106 is configured to allow a predetermined amount of light to pass therethrough. That is, the light receiving region 101 is configured to receive light. For example, an indium tin oxide (ITO) layer, which is a transparent conductive material, or a thin metallic layer is used as the upper electrode S 106. In this embodiment, the charge hold region 103 is shielded against light. Specifically, a light shield layer 105 for blocking incident light is disposed on the charge transfer region 102 and the charge hold region 103. With part of the light shield layer 105 being disposed on the charge transfer region 102, generation of charges in the charge transfer region 102 during charge transfer can be suppressed. Accordingly, noise can be reduced. Also, with part of the light shield layer 105 being disposed on the charge hold region 103, generation of charges in the charge hold region 103 while charges are held in the charge hold region 103 can be suppressed. Accordingly, noise can be reduced.

A blocking layer 107 for reducing charge injection from the upper electrode S 106 to the semiconductor layer 108 is disposed between the upper electrode S 106 and the semiconductor layer 108. The blocking layer 107 may be composed of a material having a band gap different from that of the semiconductor layer 108. Alternatively, the blocking layer 107 may be composed of a material having impurity concentration different from that of the semiconductor layer 108. An insulating layer 109 is disposed between the electrode P 110 and the semiconductor layer 108. The insulating layer 109 extends between the electrode M 112 and the semiconductor layer 108 and between a transfer electrode T 111 and the semiconductor layer 108. According to a modification example of this embodiment, either or both of the blocking layer 107 and the insulating layer 109 are omitted.

The charge transfer region 102 is disposed between the light receiving region 101 and the charge hold region 103. The pixel 100 includes the transfer electrode T 111 that controls the bias voltage to be applied to the charge transfer region 102 and a power supply VT 114 connected to the transfer electrode T 111. The power supply VT 114 supplies a voltage Vt. According to a modification example of this embodiment, the charge transfer region 102 and the transfer electrode T 111 are omitted.

A voltage Vm is supplied from a power supply VD 115 to the electrode M 112 via a first capacitor Cm 116. The pixel 100 includes a reset transistor 117 and an amplification transistor 118 that are connected to the electrode M 112. Furthermore, the pixel 100 includes a selection transistor 119 disposed on an electric path between the amplification transistor 118 and an output line 120. The reset transistor 117, the amplification transistor 118, and the selection transistor 119 are examples of elements included in a pixel circuit. The amplification transistor 118 outputs signals based on the charges generated in the light receiving region 101. The reset transistor 117 resets the voltage of an input node of the amplification transistor 118. The selection transistor 119 controls the connection between the amplification transistor 118 and the output line 120. A plurality of pixels 100 are connected to one output line 120. In a case where the plurality of pixels 100 constitute a pixel array including a plurality of pixel columns, one or a plurality of output lines 120 are disposed in each pixel column. A current source 121 and a column amplifier 301 are connected to the output line 120. The amplification transistor 118 and the current source 121 constitute a source follower circuit. A signal output from the pixel 100 to the output line 120 is input to the column amplifier 301.

The reset transistor 117, the amplification transistor 118, and the selection transistor 119 are disposed on a substrate that is not illustrated. The substrate is, for example, a silicon substrate. The semiconductor layer 108 is disposed on the substrate on which a pixel circuit including the amplification transistor 118 is disposed. From another point of view, the semiconductor layer 108 is stacked on the substrate on which the pixel circuit is disposed.

Figure 1B:
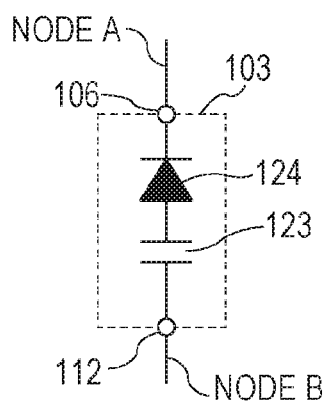
FIG. 1B illustrates an equivalent circuit of a photoelectric conversion portion.
Figure 1C:
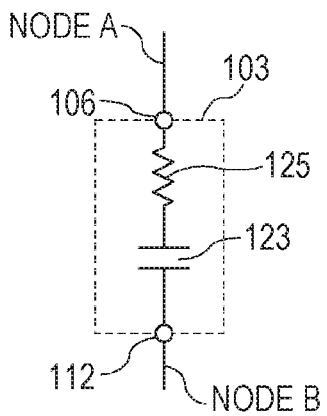
FIG. 1C illustrates an equivalent circuit of a photoelectric conversion portion.

FIGS. 1B and 1C illustrate an example of equivalent circuits of a charge hold portion including the charge hold region 103. In this embodiment, the charge hold portion includes the semiconductor layer 108 and the insulating layer 109. Thus, the charge hold portion includes a capacitance component between the upper electrode S 106 and the electrode M 112. The equivalent circuits in FIGS. 1B and 1C illustrate the capacitance component as a second capacitor 123 disposed between the upper electrode S 106 and the electrode M 112. FIG. 1B illustrates an embodiment in which the charge hold portion includes the blocking layer 107. Thus, the blocking layer 107 and the semiconductor layer 108 are illustrated as a diode 124. FIG. 1C illustrates an embodiment in which the semiconductor layer 108 does not include a blocking layer. Thus, the semiconductor layer 108 is illustrated as a resistor 125. The structure of the semiconductor layer 108 will be described below.

In this embodiment, the light receiving region 101 and the charge hold region 103 are disposed in a continuous portion of the semiconductor layer 108. The continuous portion of the semiconductor layer 108 is, for example, a portion composed of a substantially homogeneous material in the semiconductor layer 108. Manufacturing errors occur during manufacturing of the image pickup device. Thus, the continuous portion of the semiconductor layer 108 may include a variation in material caused by the manufacturing errors. From another point of view, the continuous portion of the semiconductor layer 108 is a portion that is simultaneously formed in the semiconductor layer 108. After the continuous portion of the semiconductor layer 108 is simultaneously formed, only a part thereof may be processed. Thus, the continuous portion of the semiconductor layer 108 may include a plurality of portions having different thicknesses or different widths.

The functions of the individual portions of the pixel 100 will be described. The light receiving region 101 of the semiconductor layer 108, the first portion (first electrode) of the upper electrode S 106 disposed on the light receiving region 101, the electrode P 110, and the insulating layer 109 disposed between the semiconductor layer 108 and the electrode P 110 constitute a photoelectric conversion portion. The photoelectric conversion portion generates charges in accordance with incident light and accumulates the generated charges as signal charges. In accordance with the voltage applied between the upper electrode S 106 and the electrode P 110, accumulation of signal charges in the photoelectric conversion portion and discharge or transfer of signal charges from the photoelectric conversion portion can be controlled.

The charge hold region 103 of the semiconductor layer 108, the second portion (third electrode) of the upper electrode S 106 disposed on the charge hold region 103, the electrode M 112, and the insulating layer 109 disposed between the semiconductor layer 108 and the electrode M 112 constitute a charge hold portion. The charge hold portion holds signal charges in a place different from the photoelectric conversion portion. With the bias voltage supplied to the electrode M 112 being controlled, signals can be read from the charge hold portion.

The charge transfer region 102 of the semiconductor layer 108, the upper electrode S 106, the transfer electrode T 111, and the insulating layer 109 disposed between the semiconductor layer 108 and the transfer electrode T 111 constitute a charge transfer portion. In this embodiment, the light receiving region 101 and the charge hold region 103 are disposed in the continuous portion of the semiconductor layer 108 with the charge transfer region 102 therebetween. With this configuration, the charge transfer portion is able to transfer the charges accumulated in the light receiving region 101 to the charge hold region 103. Transfer of the charges is controlled by the bias voltage supplied to the transfer electrode T 111.

In this embodiment, the light receiving region 101, the charge transfer region 102, and the charge hold region 103 are disposed in different portions of the semiconductor layer 108 that is continuous. The individual regions are controlled independently of one another. Accordingly, the light receiving region 101, the charge transfer region 102, and the charge hold region 103 implement different functions. The light receiving region 101 has a function of generating charges by photoelectric conversion and a function of accumulating the charges. The charge transfer region 102 has a function of transferring charges from the light receiving region 101 to the charge hold region 103. The charge hold region 103 has a function of holding charges independently of the light receiving region 101.

Next, the pixel circuit of the pixel 100 will be described. The electrode M 112 and the gate of the amplification transistor 118 are electrically connected to each other. As illustrated in FIG. 1A, the electrode M 112 and the gate of the amplification transistor 118 may be short-circuited. Alternatively, a switch may be disposed on the electric path between the electrode M 112 and the amplification transistor 118.

In FIG. 1A, the node constituted by the electrode M 112 and the gate of the amplification transistor 118 is illustrated as a node B. The node B can be electrically floating. With the node B being electrically floating, the voltage of the node B may be changed in accordance with the charges held in the charge hold region 103. With this configuration, signals based on the charges that are generated by photoelectric conversion and held in the charge hold region 103 can be input to the amplification transistor 118. The amplification transistor 118 amplifies the input signals and outputs them to the output line 120.

The pixel circuit of the pixel 100 includes the reset transistor 117 that resets the voltage of the electrode M 112. The reset transistor 117 supplies a reset voltage Vres to the electrode M 112 and the gate of the amplification transistor 118. That is, the reset transistor 117 resets the voltage of the input node (node B) of the amplification transistor 118. The resent transistor 117 is controlled so that ON/OFF thereof can be switched. When the reset transistor 117 is turned on, the reset voltage Vres is supplied to the node B. When the reset transistor 117 is turned off, the node B becomes electrically floating.

The first capacitor Cm 116 is electrically connected to the electrode M 112. The electrode M 112 and the first capacitor Cm 116 may be short-circuited. Alternatively, a switch may be provided on the electric path between the electrode M 112 and the first capacitor Cm 116.

The first capacitor Cm 116 is formed of two electrodes facing each other with an insulator therebetween. The two electrodes are composed of a conductive material, such as polysilicon or metal. Alternatively, the first capacitor Cm 116 includes a semiconductor region and a gate electrode that is disposed on the semiconductor region via a gate insulating film. The semiconductor region included in the first capacitor Cm 116 may have higher impurity concentration than the source region or drain region of a transistor. The gate electrode is composed of a conductive material, such as polysilicon or metal.

The first capacitor Cm 116 includes a first terminal electrically connected to the electrode M 112 and a second terminal different from the first terminal. Each terminal may be composed of a conductive material, such as metal or polysilicon, or a semiconductor region. A predetermined voltage is supplied to the second terminal. In this embodiment, the second terminal is connected to the power supply VD 115, and a plurality of voltages are supplied from the power supply VD 115. Alternatively, the second terminal may be grounded. In FIG. 1A, the node B includes the first terminal, and a node C includes the second terminal.

Next, control of the pixel 100 will be described. First, in an exposure period, the voltages of the upper electrode S 106 and the electrode P 110 are controlled so that a reversed bias is applied to the light receiving region 101. Accordingly, the signal charges generated in the light receiving region 101 are accumulated in the light receiving region 101 during the exposure period. Subsequently, the voltages of the electrode P 110, the transfer electrode T 111, and the electrode M 112 are controlled to transfer the charges accumulated in the light receiving region 101 to the charge hold region 103. The charges can be transferred by, for example, making the potential of the charge hold region 103 lower than the potential of the light receiving region 101. With the charge transfer being performed, the signal charges are held in the charge hold region 103 after the exposure period has elapsed.

To read signals held in the charge hold region 103, the semiconductor layer 108 is depleted. Specifically, the charges in the semiconductor layer 108 are discharged to the upper electrode S 106. The charges can be discharged by controlling the voltage between the upper electrode S 106 and the electrode M 112. For this purpose, in this embodiment, the voltage of the second terminal of the first capacitor Cm 116 is controlled. The power supply VD 115 supplies a first voltage and a second voltage different from the first voltage, the voltages serving as a voltage Vd, to the second terminal of the first capacitor Cm 116. In a modification example of this embodiment, a power supply VM (not illustrated) supplies the first voltage and the second voltage different from the first voltage, the voltages serving as a voltage Vm, to the electrode M 112. In another modification example of this embodiment, the power supply VS 104 supplies the first voltage and the second voltage different from the first voltage, the voltages serving as a voltage Vs, to the upper electrode S 106. In these modification examples, the second terminal of the first capacitor Cm 116 is grounded or the first capacitor Cm 116 is omitted.

A description will be given of an operation of controlling the voltage of a node different from the electrode M 112. When the voltage of the upper electrode S 106 or the voltage of the second terminal of the first capacitor Cm 116 is changed, the voltage of the electrode M 112 is changed in accordance with the ratio of the capacitance value of the first capacitor Cm 116 to the capacitance value of the second capacitor 123 formed of the upper electrode S 106 and the electrode M 112. This is because, in the equivalent circuit of the pixel, the first capacitor Cm 116 and the second capacitor 123 are illustrated as two capacitors connected in series, and the electrode M 112 (node B) is included in the node between the two capacitors.

In this embodiment, the voltage of the electrode M 112 or the voltage of the second terminal of the first capacitor Cm 116, the voltage Vres supplied by the reset transistor 117, the capacitance value of the first capacitor Cm 116, and the capacitance value of the second capacitor 123 have a predetermined relationship. With this relationship being satisfied, a voltage for depleting the semiconductor layer 108 can be applied between the upper electrode S 106 and the electrode M 112 even if the voltage of the electrode M 112 is changed. Thus, the amount of charges not discharged from the semiconductor layer 108 can be reduced. As a result, noise can be reduced.

With the above-described control, a global electronic shutter operation can be performed. Specifically, accumulation of signal charges by the photoelectric conversion portion and transfer of charges to the charge hold portion are performed simultaneously or collectively in a plurality of pixels 100. Subsequently, signals are sequentially read from the plurality of pixels 100. In this embodiment, signal charges are held in the charge hold region 103 of the semiconductor layer 108 until the signals are read. Thus, noise added to the signal charges that are held can be reduced by suppressing a dark current generated in the semiconductor layer 108. Furthermore, since the charge hold region 103 is electrically isolated from the input node of the amplification transistor 118, noise can be reduced by CDS or the like.

The voltages applied to the individual portions of the pixel 100 will be described. In this embodiment, a description will be given of the case of using, as signal charges, holes among charges generated through photoelectric conversion. In this specification, the voltage of a grounded node is a reference voltage of 0 V unless otherwise specified.

A predetermined voltage Vs (in this embodiment, 6 V) is supplied to the upper electrode S 106 from the power supply VS 104. A predetermined voltage Vp (in this embodiment, 3 V) is supplied to the electrode P 110 of the photoelectric conversion portion from the power supply VP 113. The voltage Vs and the voltage Vp have a relationship for applying a reversed bias to holes in the light receiving region 101. The holes generated through photoelectric conversion are accumulated near the interface between the semiconductor layer 108 in the light receiving region 101 and the insulating layer 109. The portion other than the light receiving region 101 of the semiconductor layer 108 is shielded against light by the light shield layer 105. Thus, photoelectric conversion is mainly performed in the light receiving region 101.

In this embodiment, signal charges are holes and thus the voltage Vp of the electrode P 110 is lower than the voltage Vt of the transfer electrode T 111. As will be described below with reference to FIGS. 4A to 4C, the transfer electrode T 111 is disposed to surround the surrounding of the electrode P 110 in a plane parallel to the surface of the substrate. Thus, by setting a relationship expressed by Vp<Vt, a potential well is formed in the light receiving region 101 disposed near the electrode P 110. The holes generated through photoelectric conversion are efficiently collected to the potential well in the light receiving region 101. Furthermore, the voltage Vt of the transfer electrode T 111 forms a potential barrier, and thus leakage of charges accumulated in the light receiving region 101 can be reduced. In a case where signal charges are electrons, the voltage Vp of the electrode P 110 is set to be higher than the voltage Vt of the transfer electrode T 111.

In this embodiment, the power supply VD 115 supplies, to the second terminal of the first capacitor Cm 116, at least a first voltage Vd1 and a second voltage Vd2 different from the first voltage Vd1. In this embodiment, signal charges are holes and thus the second voltage Vd2 is higher than the first voltage Vd1. In this embodiment, the first voltage Vd1 is 2 V whereas the second voltage Vd2 is 8 V. In a case where signal charges are electrons, the second voltage Vd2 is lower than the first voltage Vd1. In a case where signal charges are electrons, for example, the first voltage Vd1 is 8 V whereas the second voltage Vd2 is 2 V.

In a case where signal charges are holes, the reset voltage Vres is lower than the voltage Vs supplied to the upper electrode S 106. In a case where signal charges are electrons, the reset voltage Vres is higher than the voltage Vs supplied to the upper electrode S 106. In this embodiment, signal charges are holes, and thus the voltage Vs supplied to the upper electrode S 106 is 6 V and the reset voltage Vres is 3 V.

In this embodiment, by supplying the voltage Vd including a plurality of voltages to the node C, the power supply VD 115 controls the voltage Vm of the node B that is capacitively coupled to the node C via the first capacitor Cm 116. Thus, a relationship of a direct current magnitude between the voltage Vd supplied to the node C and the reset voltage Vres or the voltage Vs supplied to the upper electrode S 106 is not particularly limited.

In this embodiment, the voltage Vp supplied to the electrode P 110, the voltage Vt supplied to the transfer electrode T 111, and the voltage Vm supplied to the electrode M 112 are controlled, and thereby the signal charges accumulated in the light receiving region 101 are quickly and completely transferred to the charge hold region 103. In a case where the signal charges are holes, the charges can be transferred on the basis of the relationship expressed by Vp>Vt>Vm. In a case where the signal charges are electrons, the charges can be transferred on the basis of the relationship expressed by Vp<Vt<Vm.

Figure 2:
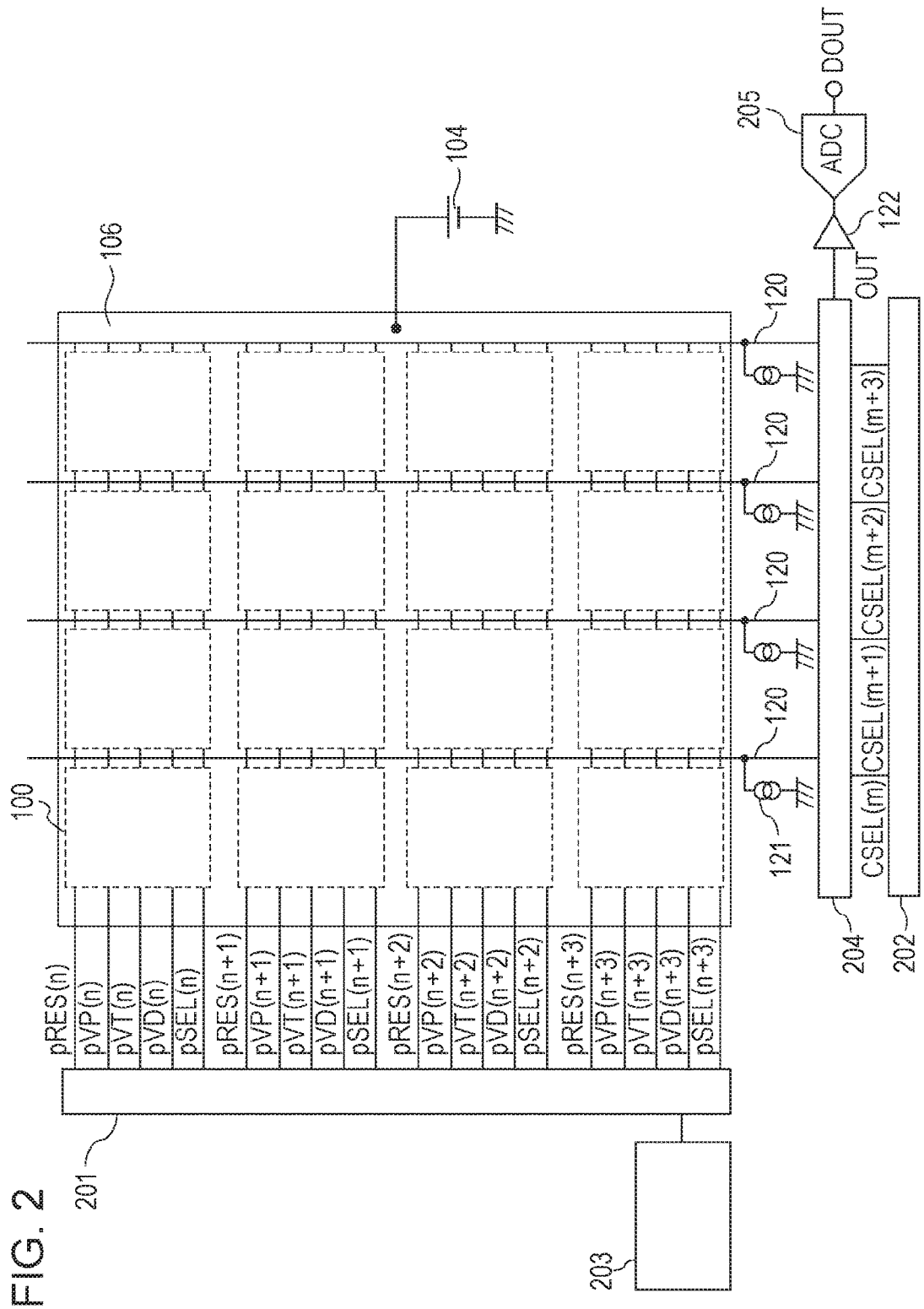
FIG. 2 schematically illustrates the entire configuration of the image pickup device.

FIG. 2 schematically illustrates the entire circuit configuration of the image pickup device according to this embodiment. FIG. 2 illustrates sixteen pixels 100 arranged in a matrix of four rows and four columns. A plurality of pixels 100 included in one column are connected to one output line 120. A row drive circuit 201 supplies, to the pixels 100, a drive signal pRES, a drive voltage pVP (the voltage VP of the electrode P 110), a drive voltage pVT (the voltage Vt of the transfer electrode T 111), a drive voltage pVD (the voltage Vd of the node C), and a drive signal pSEL. The drive signal pRES is supplied to the gate of the reset transistor 117 illustrated in FIG. 1A. The drive signal pSEL is supplied to the gate of the selection transistor 119. The reset transistor 117 and the selection transistor 119 are controlled by these drive signals. The plurality of pixels 100 included in one row are connected to common drive signal lines. The drive signal lines are wiring lines for transmitting the above-described drive signal pRES, drive signal pSEL, and so forth. In FIG. 2, reference symbols denoting individual rows, such as (n) and (n+1), are attached to distinguish the drive signals supplied to different rows. The same applies to the other figures. In FIG. 2, the illustration of the light shield layer 105 is omitted.

In this embodiment, the voltage Vd supplied to the second terminal (node C) of the first capacitor Cm 116 is controlled independently in each row. Thus, the row drive circuit 201 selects the row to which the voltage Vd is to be supplied from a voltage supplier 203. Reference symbols denoting individual rows, such as (n) and (n+1), are attached to distinguish the voltages Vd supplied to different rows. In this embodiment, a description will be given of the case of performing a global electronic shutter operation. In this case, the drive voltage pVP, the drive voltage pVT, and the drive voltage pVD are collectively driven in all the rows. Alternatively, a rolling shutter operation may be performed. In this case, control is performed for each row. With the above-described configuration, the plurality of pixels 100 can be driven in units of rows in this embodiment.

Each output line 120 is connected to a corresponding one of column circuits 204. The column amplifier 301 illustrated in FIG. 1A is included in the column circuit 204. A column drive circuit 202 drives the column circuits 204 in units of columns. Specifically, the column drive circuit 202 supplies drive signals CSEL to the plurality of column circuits 204. Reference symbols denoting individual columns, such as (m) and (m+1), are attached to distinguish the drive signals supplied to different columns. The same applies to the other figures. With this configuration, the signals read in parallel in units of rows can be sequentially output to an output unit.

Figure 3:
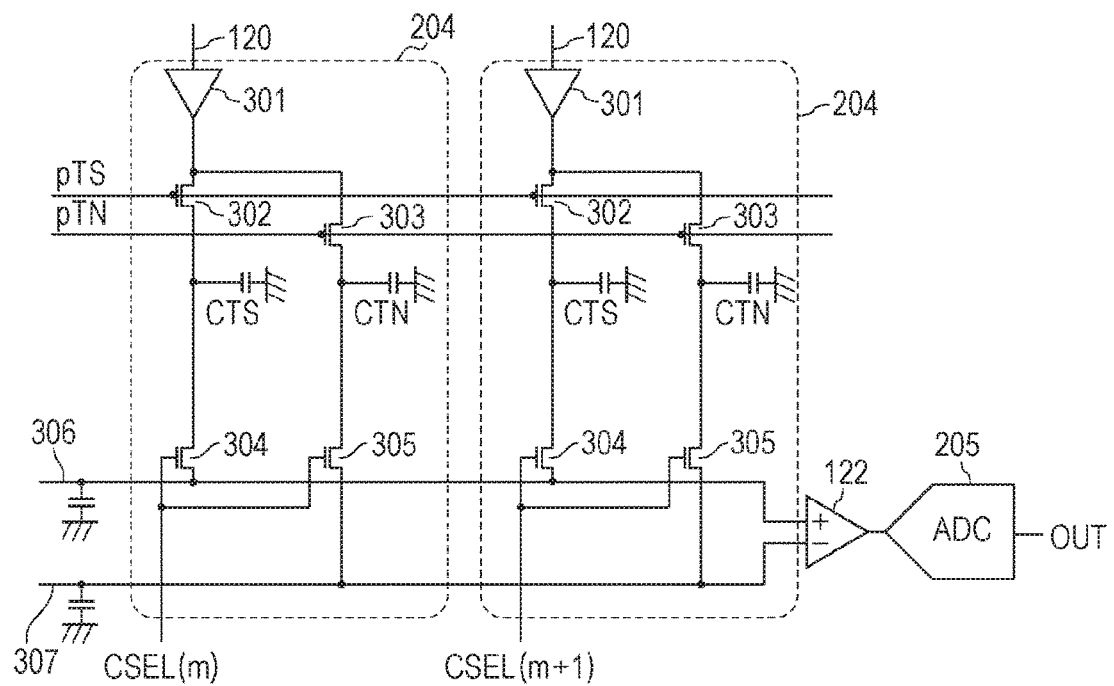
FIG. 3 illustrates an equivalent circuit of a column circuit of the image pickup device.

The column circuits 204 will be described in detail. FIG. 3 is an equivalent circuit diagram of the column circuits 204 in the m-th column and the m+1-th column. The illustration of the column circuits 204 in the other columns is omitted.

The signal on the output line 120 is amplified by the column amplifier 301. The output node of the column amplifier 301 is connected to a capacitor CTS via an S/H switch 302. Also, the output node of the column amplifier 301 is connected to a capacitor CTN via an S/H switch 303. The S/H switch 302 and the S/H switch 303 are controlled by a drive signal pTS and a drive signal pTN, respectively. With this configuration, a noise signal N including reset noise and a light signal S from the pixel 100 can be held. Thus, the image pickup device according to this embodiment is able to perform correlated double sampling, that is, to read a signal from which reset noise has been removed.

The capacitor CTS is connected to a horizontal output line 306 via a horizontal transfer switch 304. The capacitor CTN is connected to a horizontal output line 307 via a horizontal transfer switch 305. The horizontal transfer switches 304 and 305 are controlled by a drive signal CSEL supplied from the column drive circuit 202.

Both the horizontal output lines 306 and 307 are connected to an output amplifier 122. The output amplifier 122 amplifies a difference signal representing a difference between the signal on the horizontal output line 306 and the signal on the horizontal output line 307 and outputs the difference signal. The amplified signal is input to an analog-to-digital converter (ADC) 205, is converted from an analog signal to a digital signal, and is output to the outside of the image pickup device.

Each column circuit 204 may be an analog-to-digital conversion circuit. In this case, the analog-to-digital conversion circuit includes a holding unit that holds digital signals of a memory or counter. The holding unit holds the noise signal N and the light signal S that have been converted to digital signals.

Figure 4A:
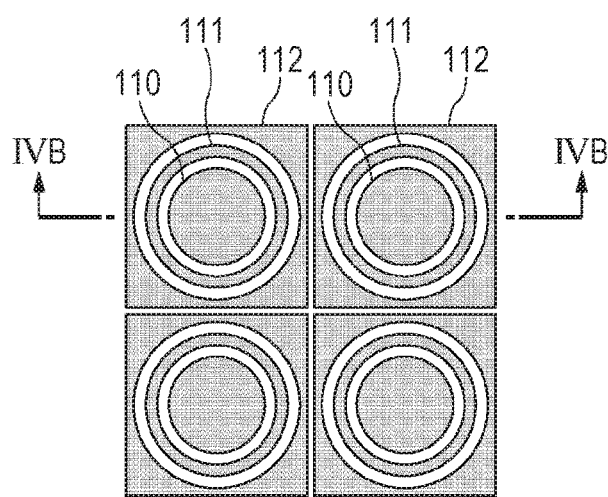
FIG. 4A schematically illustrates a plane structure of the image pickup device, FIG. 4B schematically illustrates a cross-sectional structure of the image pickup device, and FIG. 4C schematically illustrates a plane structure of the image pickup device.

Next, the plane structure and cross-sectional structure of the image pickup device according to this embodiment will be described. FIG. 4A schematically illustrates the plane structure of the image pickup device. The same parts as those in FIGS. 1A to 1C are denoted by the same reference numerals. FIG. 4A illustrates the pixels 100 in two rows and two columns. FIG. 4A schematically illustrates the arrangement of the electrode P 110, the transfer electrode T 111, and the electrode M 112 in a plane parallel to the surface of the substrate on which the pixel circuit is disposed.

Figure 4B:
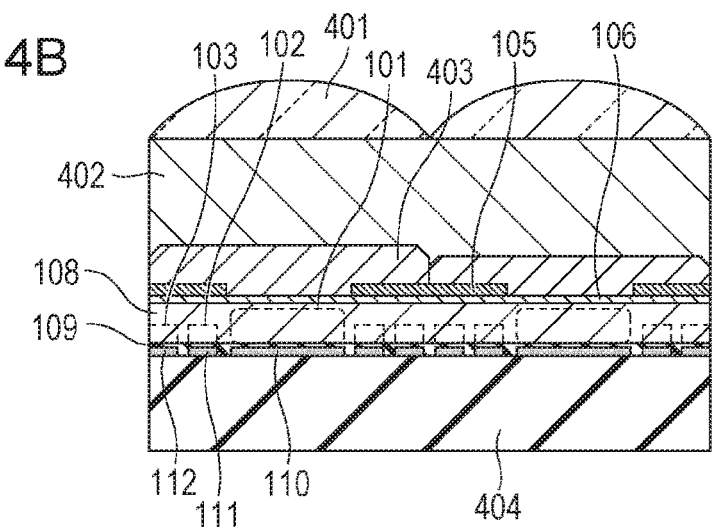

FIG. 4B schematically illustrates the cross-sectional structure of the image pickup device. The cross-section illustrated in FIG. 4B corresponds to the cross-section taken along line IVB-IVB in FIG. 4A. The same parts as those in FIGS. 1A to 1C are denoted by the same reference numerals. FIG. 4B illustrates a microlens 401, a planarized layer 402, a color filter 403, and an interlayer film 404 disposed between the semiconductor layer 108 and the substrate. The light receiving region 101, the charge transfer region 102, and the charge hold region 103 in the semiconductor layer 108 are illustrated. A conductive member (not illustrated) for connecting the electrodes to the pixel circuit is disposed in the interlayer film 404.

As illustrated in FIG. 4B, the electrode P 110, the transfer electrode T 111, and the electrode M 112 are disposed such that the centers of gravity thereof match. With this configuration, the microlens 401 is able to efficiently focus incident light on the photoelectric conversion portion (the light receiving region 101 and the electrode P 110). The electric-field distribution and the light incidence distribution of the photoelectric conversion portion correspond to each other, and accordingly the charges generated through photoelectric conversion are efficiently collected in the light receiving region 101.

In the plane illustrated in FIG. 4A, the transfer electrode T 111 is disposed to surround the electrode P 110. With such an arrangement, the charges accumulated in the light receiving region 101 can be quickly transferred to the charge hold region 103. As a result, the image pickup device can be driven at high speed. Furthermore, a bias voltage applied to the transfer electrode T 111 enables a potential barrier to be formed. Accordingly, generated charges can be efficiently collected in the light receiving region 101. Also, leakage of the collected charges to the charge hold region 103 or adjacent pixels can be suppressed. The charges can be quickly and completely transferred during charge transfer.

Figure 4C:
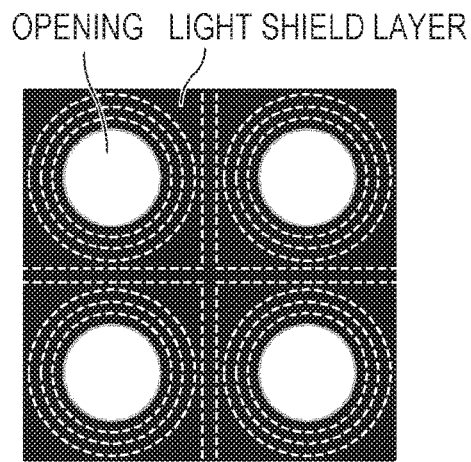

FIG. 4C schematically illustrates the plane structure of the light shield layer 105. The broken lines represent the shapes of the electrode P 110, the transfer electrode T 111, and the electrode M 112.

Figure 5A:
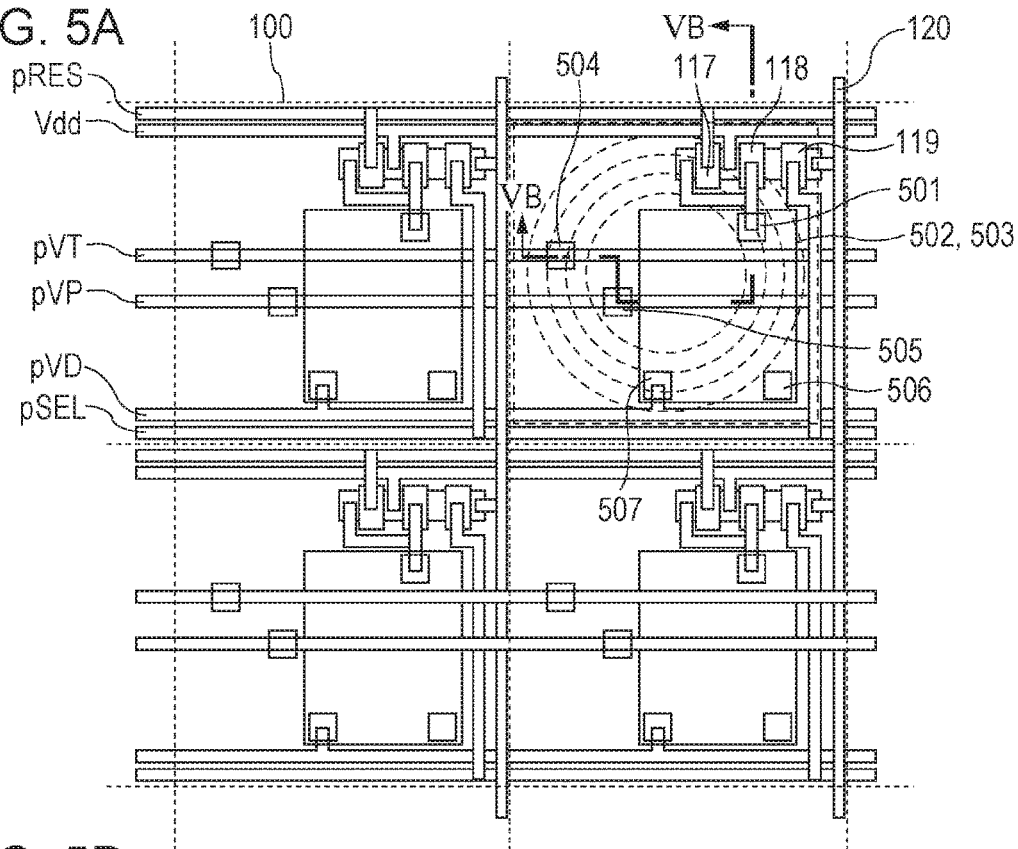
FIG. 5A schematically illustrates a plane structure of the image pickup device, and FIG. 5B schematically illustrates a cross-sectional structure of the image pickup device.
Figure 5B:
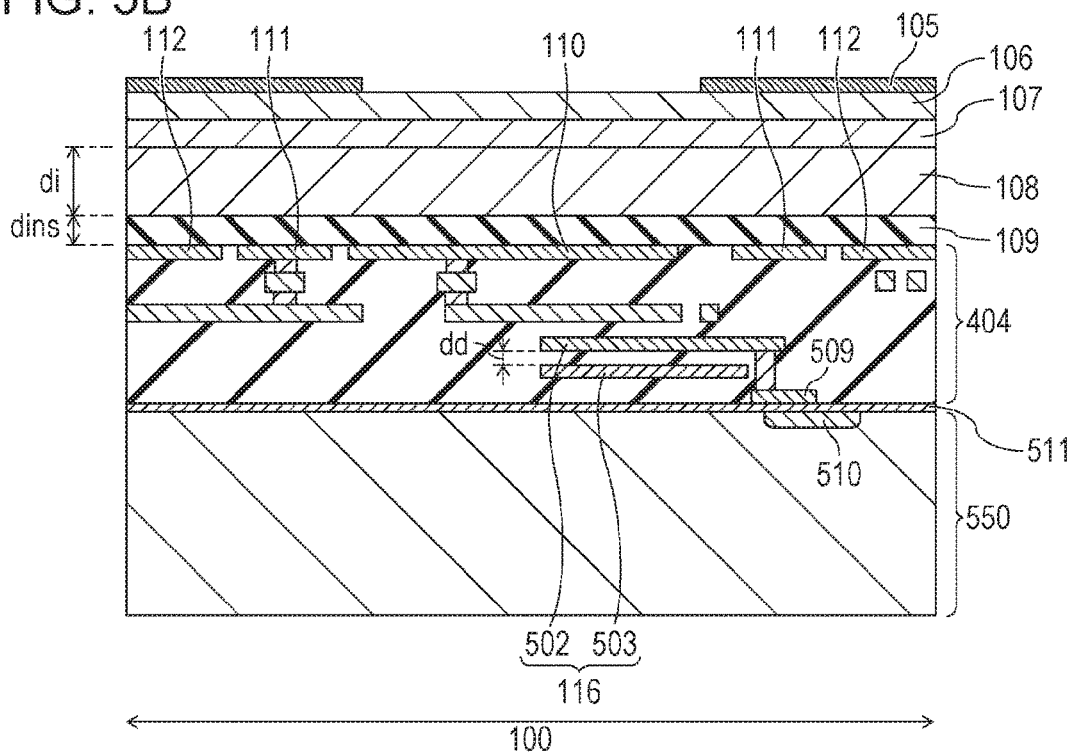

Next, the plane structure and cross-sectional structure of the pixel circuit disposed on the substrate will be described. FIG. 5A schematically illustrates the arrangement in plan view of the pixel circuit disposed on the substrate. That is, FIG. 5A illustrates an arrangement in a case where the pixel circuit is projected onto a plane parallel to the surface of the substrate. FIG. 5B schematically illustrates the cross-sectional structure of a substrate 550, and the interlayer film 404 and the semiconductor layer 108 stacked on the substrate 550. The cross-section illustrated in FIG. 5B corresponds to the cross-section taken along line VB-VB in FIG. 5A. The parts having the same functions as those in FIGS. 1A to 1C are denoted by the same reference numerals. Note that, regarding the transistors, reference numerals are attached to the corresponding gate electrodes. The conductive members forming drive signal lines are denoted by the same reference symbols as those of the drive signals supplied to the drive signal lines. For example, the conductive member denoted by pRES forms a drive signal line for supplying the drive signal pRES.

FIG. 5A illustrates four pixels 100 arranged in a matrix of two rows and two columns. Only in the upper-right pixel, the parts corresponding to the electrode P 110, the transfer electrode T 111, and the electrode M 112 illustrated in FIG. 4A are illustrated by using broken lines. The illustration of these electrodes is omitted in the other pixels. FIG. 5A illustrates an electrode 502 that forms the first terminal of the first capacitor Cm 116 and an electrode 503 that forms the second terminal. The electrodes 502 and 503 are arranged such that they overlap each other in plan view.

As illustrated in FIG. 5A, the electrode 502 that forms the first terminal of the first capacitor Cm 116 and the amplification transistor 118 are electrically connected to each other via a contact 501. The electrode 502 that forms the first terminal of the first capacitor Cm 116 and the electrode M 112 are electrically connected to each other via a contact 506. The electrode 503 that forms the second terminal of the first capacitor Cm 116 and a drive signal line pVD are connected to each other via a contact 507. A contact 504 connects the transfer electrode T 111 and a drive signal line pVT to each other. A contact 505 connects the electrode P 110 and a drive signal line pVP to each other.

As illustrated in FIGS. 5A and 5B, the electrode 503 of the first capacitor Cm 116 is connected to the drive signal line pVD. The drive signal line pVD transmits the voltage Vd from the power supply VD 115. In this embodiment, the drive signal line pVD is arranged for each row. That is, the drive signal line pVD of a row and the drive signal line pVD of another row are electrically insulated from each other. With this configuration, the voltage Vd of the second terminal (node C) of the first capacitor Cm 116 can be controlled independently in each row.

As illustrated in FIG. 5B, the image pickup device includes the substrate 550. The source regions and drain regions of pixel transistors are arranged in the substrate 550. The pixel transistors are transistors included in the pixel circuit, for example, the reset transistor 117, the amplification transistor 118, and the selection transistor 119. The interlayer film 404, including the gate electrodes of the pixel transistors and conductive members that form wiring lines, is disposed on the substrate 550. The insulating layer 109 and the semiconductor layer 108 are disposed on the interlayer film 404.

The upper electrode S 106 is formed of a conductive member that allows a certain amount of light to pass therethrough. For example, indium such as indium tin oxide (ITO) and/or a compound containing tin or a compound such as ZnO may be used as the material of the upper electrode S 106. With this configuration, a large amount of light can enter the light receiving region 101, and accordingly the sensitivity can be increased. As another example, a polysilicon material or metallic material having a thickness allowing a certain amount of light to pass therethrough may be used for the upper electrode S 106. Since metal has a low resistance, an embodiment in which metal is used as a material of the upper electrode S 106 is beneficial to lower power consumption or higher driving speed. The light transmittance of the upper electrode S 106 is not particularly limited as long as the light transmittance is not zero.

For the light shield layer 105, a material having a low light transmittance is used. In one embodiment, a material having a lower light transmittance than the upper electrode S 106 is used for the light shield layer 105. For example, a material such as metal or an organic resin is used for the light shield layer 105. In a case where metal is used for the light shield layer 105, the light shield layer 105 and the upper electrode S 106 are electrically connected to each other. With this configuration, the resistance of the upper electrode S 106 can be effectively reduced, and accordingly the operation speed can be increased. In this embodiment, the light shield layer 105 is disposed on the upper electrode S 106. In a modification example of this embodiment, the light shield layer 105 is disposed between the upper electrode S 106 and the charge hold region 103.

The semiconductor layer 108 is composed of intrinsic amorphous silicon (a-Si), a low concentration p-type a-Si, a low concentration n-type a-Si, or the like. Alternatively, the semiconductor layer 108 may be composed of a compound semiconductor. Examples of the compound semiconductor include III-V compound semiconductors such as BN, GaAs, GaP, AlSb, and GaAlAsP, II-VI compound semiconductors such as CdSe, ZnS, and HdTe, and IV-VI compound semiconductors such as PbS, PbTe, and CuO. Alternatively, the semiconductor layer 108 may be composed of an organic material. For example, fullerene, coumarin 6 (C6), rhodamine 6G (R6G), zinc phthalocyanine (ZnPc), quinacridon, phthalocyanine compound, or naphthalocyanine compound may be used. Furthermore, a quantum dot film composed of the above-described compound semiconductor may be used for the semiconductor layer 108. The semiconductor layer 108 may have low impurity concentration or the semiconductor layer 108 may be intrinsic. With this configuration, a sufficient depletion layer can be expanded in the semiconductor layer 108, and thus the sensitivity can be increased and noise can be reduced.

The blocking layer 107 inhibits the injection of charges of the same conductivity type as signal charges from the upper electrode S 106 to the semiconductor layer 108. In a case where the upper electrode S 106 is composed of ITO, the upper electrode S 106 may also be used as the blocking layer 107 depending on the combination with the semiconductor that forms the semiconductor layer 108. That is, a potential barrier may be formed so that charges of the same conductivity type as signal charges are not injected from the upper electrode S 106 to the semiconductor layer 108.

For the blocking layer 107, a semiconductor of the same type as the semiconductor used for the semiconductor layer 108, that is, an n-type or p-type semiconductor with impurity concentration higher than the semiconductor used for the semiconductor layer 108, may be used. For example, in a case where a-Si is used for the semiconductor layer 108, n-type a-Si with high impurity concentration or p-type a-Si with high impurity concentration is used for the blocking layer 107. The position of the Fermi level varies in accordance with a difference in impurity concentration, and thus a potential barrier can be formed for only one of electrons and holes. The conductivity type of the blocking layer 107 is a conductivity type in which charges of a conductivity type opposite to signal charges are majority carriers.

Alternatively, the blocking layer 107 may be composed of a material different from that of the semiconductor layer 108. With this configuration, a heterojunction is formed. Since the band gap varies among materials, a potential barrier can be formed for only one of electrons and holes.

The insulating layer 109 is disposed between the semiconductor layer 108 and each of the electrode P 110, the transfer electrode T 111, and the electrode M 112. An insulating material is used for the insulating layer 109. Examples of the material of the insulating layer 109 include an inorganic material such as silicon oxide, amorphous silicon oxide (a-SiO), silicon nitride, or amorphous silicon nitride (a-SiN), or an organic material. The insulating layer 109 may have a thickness to prevent charges from being transmitted due to a tunnel effect. With this configuration, leak current can be reduced and thus noise can be reduced. Specifically, the insulating layer 109 may have a thickness of 50 nm or more.

In the case of using a-Si, a-SiO, or a-SiN for the blocking layer 107, the semiconductor layer 108, and the insulating layer 109, hydrotreatment may be performed and a dangling bond may be terminated by hydrogen. With this configuration, noise can be reduced.

Each of the electrode P 110, the transfer electrode T 111, and the electrode M 112 is formed of a conductive member of metal or the like. The same material as that of the conductive member that forms wiring lines or the conductive member that forms a pad electrode for connection with an external component is used for the electrode P 110, the transfer electrode T 111, and the electrode M 112. With this configuration, some or all of the electrode P 110, the transfer electrode T 111, the electrode M 112, the wiring lines, and the pad electrode can be simultaneously formed. Accordingly, the manufacturing process can be simplified.

Operations according to this embodiment will be described with reference to FIGS. 6A to 6F. FIGS. 6A to 6C schematically illustrate the operation of signal charges (holes) in the semiconductor layer 108. FIGS. 6D to 6F schematically illustrate the potential at the interface between the semiconductor layer 108 and the insulating layer 109. In each of FIGS. 6D to 6F and FIG. 7, the vertical axis represents potential with respect to holes. The potential with respect to holes is lower at an upper side of the vertical axis. Thus, the voltage is lower at an upper side of the vertical axis. The energy level of free electrons is illustrated for the upper electrode S 106, the electrode P 110, and the electrode M 112. The band gap between the energy level in a conduction band and the energy level in a valence band is illustrated for the blocking layer 107 and the semiconductor layer 108. The potential of the semiconductor layer 108 at the interface between the semiconductor layer 108 and the insulating layer 109 is referred to as a surface potential of the semiconductor layer 108 or simply as a surface potential for convenience.

FIG. 6A illustrates a state where the holes generated through photoelectric conversion in the light receiving region 101 are accumulated in the light receiving region 101. FIG. 6D schematically illustrates the potential with respect to the holes in the light receiving region 101, the charge transfer region 102, and the charge hold region 103 corresponding to FIG. 6A. White circles represent holes. In this case, the voltage Vp of the electrode P 110, the voltage Vt of the transfer electrode T 111, and the voltage Vm of the electrode M 112 satisfy the relationship expressed by Vp=Vm<Vt. With this relationship, a potential barrier is formed between the light receiving region 101 and the charge hold region 103 and the both regions are electrically isolated from each other. That is, the transfer electrode T 111 functions as an isolation electrode for isolating the light receiving region 101 and the charge hold region 103 from each other. If Vs=Vt is satisfied, electrical isolation performance increases.

FIG. 6B illustrates a state where the holes accumulated in the light receiving region 101 are transferred to the charge hold region 103. FIG. 6E schematically illustrates the potential with respect to the holes in the light receiving region 101, the charge transfer region 102, and the charge hold region 103 corresponding to FIG. 6B. In this case, the voltage Vp of the electrode P 110, the voltage Vt of the transfer electrode T 111, and the voltage Vm of the electrode M 112 satisfy the relationship expressed by Vp=Vt>Vm or Vp>Vt>Vm. With this relationship, a potential slope is formed between the light receiving region 101 and the charge hold region 103. Thus, the holes accumulated in the light receiving region 101 are transferred to the charge hold region 103 along the interface between the semiconductor layer 108 and the insulating layer 109.

FIG. 6C illustrates an operation of reading signal charges held in the charge hold region 103 to a circuit on the semiconductor substrate. FIG. 6F schematically illustrates the potential with respect to the holes in the light receiving region 101, the charge transfer region 102, and the charge hold region 103 corresponding to FIG. 6C. With the voltage Vm of the electrode M 112 being changed, a change in voltage corresponding to the amount of charges in the charge hold region 103 occurs in the amplification transistor 118 connected to the electrode M 112.

In this embodiment, the semiconductor layer 108 continuously extends in a direction parallel to the surface of the substrate from the light receiving region 101 to the charge hold region 103 via the charge transfer region 102. Thus, as a result of transferring the charges accumulated in the light receiving region 101 simultaneously in a plurality of pixels and holding the charges in the charge hold region 103 until signals are read out, a global electronic shutter operation can be performed.

Next, an operation of reading signals based on the charges held in the charge hold region 103 will be described with reference to FIG. 7. FIG. 7 schematically illustrates the energy band of the semiconductor layer 108 along the direction perpendicular to the surface of the substrate. On the left side of FIG. 7, the energy band in the light receiving region 101 is illustrated. On the right side of FIG. 7, the energy band in the charge hold region 103 is illustrated. Regarding the light receiving region 101, the energy band of the upper electrode S 106, the blocking layer 107, the semiconductor layer 108, the insulating layer 109, and the electrode P 110 is illustrated. Regarding the charge hold region 103, the energy band of the upper electrode S 106, the blocking layer 107, the semiconductor layer 108, the insulating layer 109, and the electrode M 112 is illustrated.

As an operation in the light receiving region 101, the following steps p1 and p2 are repeatedly performed. Step p1 corresponds to transfer of charges, and step p2 corresponds to photoelectric conversion of incident light and accumulation of signal charges. Hereinafter, the individual steps will be described.

In step p1, as described above with reference to FIGS. 6A to 6F, the signal charges accumulated in the light receiving region 101 are transferred to the charge hold region 103 via the charge transfer region 102. Accordingly, the state of the light receiving region 101 changes from a state where holes are accumulated to a state where no holes exist. On the other hand, the state of the charge hold region 103 changes from a state where no holes exist to a state where holes are held.

In step p2, photoelectric conversion is performed. In the light receiving region 101, holes in electron-hole pairs generated from incident light are accumulated as signal charges. The electrons are discharged to the upper electrode S 106. As a result, the holes corresponding to the amount of incident light are accumulated at the interface between the light receiving region 101 and the insulating layer 109.

After that, steps p1 and p2 are repeated in the light receiving region 101. In the case of capturing a moving image, the repetition corresponds to the operation of one frame. This operation can be repeated at the same timing in all the pixels, and thus a global electronic shutter operation can be performed. After the collective charge transfer, the light receiving region 101 is electrically isolated from the charge hold region 103, and each region can be independently controlled.

As an operation in the charge hold region 103, the following steps m1 to m5 are repeatedly performed. Step m1 corresponds to reset of the input node of the amplification transistor 118. Step m2 corresponds to reading of a noise signal N (N read). Step m3 corresponds to transfer of charges. Step m4 corresponds to discharge of signal charges from the charge hold region 103. Step m5 corresponds to reading of a light signal S (S read). Hereinafter, the individual steps will be described.

In step m1, the reset transistor 117 is turned on. The voltage of the node including the electrode M 112, that is, the node B illustrated in FIG. 1A, is reset to the reset voltage Vres. The reset voltage Vres is, for example, 3 V.

In step m2, the reset transistor 117 is turned off. Accordingly, the node B is brought into an electrically floating state. At this time, reset noise (noise kTC) may be generated by the reset transistor 117. The selection transistor 119 is turned on, and the amplification transistor 118 outputs a noise signal N (Vres+kTC) including reset noise from the pixel 100 (N read). The noise signal N is held by the capacitor CTN of the column circuit 204.

In step m3, signal charges are transferred from the light receiving region 101 to the charge hold region 103. Step p1 in the light receiving region 101 and step m3 in the charge hold region 103 are performed simultaneously. At this time, the power supply VD 115 supplies the first voltage Vd1 to the node C illustrated in FIG. 1A.

In step m4, the power supply VD 115 supplies the second voltage Vd2 to the node C illustrated in FIG. 1A. The voltage of the electrode M 112 (node B) changes in the same direction as the change in voltage of the node C. Since holes are used as signal charges, the first voltage Vd1 and the second voltage Vd2 are set so that the voltage Vm of the electrode M 112 at this time becomes higher than the voltage Vs (=6 V) of the upper electrode S 106. In this embodiment, the first voltage Vd1 is 2 V, and the second voltage Vd2 is 8 V.

An amount of change dVB in the voltage of the electrode M 112 is determined in accordance with the ratio of a capacitance value C1 of the first capacitor Cm 116 connected to the electrode M 112 to a capacitance value C2 of the second capacitor 123 included in the charge hold region 103. Relative to an amount of change dVd in the voltage of the node C, the amount of change dVB in the voltage of the electrode M 112 is expressed by $dVB = dVd \times C1/(C1+C2)$. The node B including the electrode M 112 may include another capacitance component. However, the other capacitance component is sufficiently small compared to the capacitance value C1 of the first capacitor Cm 116. Thus, the capacitance value of the node B may be regarded as being equal to the capacitance value C1 of the first capacitor Cm 116.

In this embodiment, the amount of change dVB in the voltage of the electrode M 112 is sufficiently larger than the difference between the voltage Vs of the upper electrode S 106 and the reset voltage Vres (Vs−Vres). Thus, the potential of the electrode M 112 is lower than the potential of the upper electrode S 106, and the potential slope of the semiconductor layer 108 is inverted. Accordingly, the electrons represented by a black circle are injected from the upper electrode S 106 to the semiconductor layer 108. Also, some or all of the holes held as signal charges at the interface between the semiconductor layer 108 and the insulating layer 109 move toward the blocking layer 107. The moved holes are recombined with majority carriers in the blocking layer 107 and disappear. As a result, the holes in the semiconductor layer 108 are discharged from the semiconductor layer 108. In a case where the entire semiconductor layer 108 is depleted, all the holes held as signal charges are discharged.

Next, the first voltage Vd1 is supplied to the node C. Accordingly, the potential slope of the semiconductor layer 108 is inverted again. Thus, the electrons injected into the semiconductor layer 108 are discharged from the semiconductor layer 108. On the other hand, the blocking layer 107 inhibits injection of holes from the upper electrode S 106 to the semiconductor layer 108. Thus, the surface potential of the semiconductor layer 108 changes in accordance with the amount of holes that are held. In accordance with the change in the surface potential, the voltage of the electrode M 112 changes by a voltage Vsig corresponding to the amount of disappeared holes from the reset state. That is, the voltage Vsig corresponding to the amount of holes held as signal charges appears at the node B. The voltage Vsig corresponding to the amount of held holes is referred to as a light signal component.

In step m5, the selection transistor 119 is turned on. Accordingly, the amplification transistor 118 outputs a light signal S (Vsig+Vres+kTC) from the pixel 100. The light signal S is held by the capacitor CTS of the column circuit 204. The difference between the noise signal N (Vres+kTC) read in step m2 and the light signal S (Vsig+Vres+kTC) read in step m5 corresponds to a signal (light signal component) based on the voltage Vsig corresponding to the held signal charges.

In a case where signal charges are electrons, the second voltage Vd2 is lower than the first voltage Vd1. The reset voltage Vres is set to be lower than the voltage Vs of the upper electrode S 106.

In this embodiment, the potential slope of the semiconductor layer 108 is inverted and thereby held holes are discharged. If the potential slope of the semiconductor layer 108 is not inverted, charges that are not discharged may occur and noise may be generated. Here, the potential slope is more likely to be inverted as the amount of change dVB in the voltage of the electrode M 112 (node B) increases relative to the difference between the voltage Vs of the upper electrode S 106 and the reset voltage Vres (Vs−Vres). That is, noise can be reduced more as the amount of change dVB in the voltage of the electrode M 112 increases relative to the difference between the voltage Vs of the upper electrode S 106 and the reset voltage Vres (Vs−Vres).

As described above, there is a relationship expressed by $dVB = dVd \times C1/(C1+C2)$ between the amount of change dVd in the voltage of the node C and the amount of change dVB in the voltage of the node B. That is, the amount of change dVB in the voltage of the node B increases as the capacitance value C1 of the node B increases.

In this embodiment, the first capacitor Cm 116 is connected to the electrode M 112. Thus, the capacitance value C1 of the node B can be increased. With this configuration, the amount of change dVB in the voltage of the node B can be increased. As a result, the semiconductor layer 108 can be easily depleted and thus the charges that are not discharged can be reduced. According to this embodiment, noise can be reduced.

A configuration in which the first capacitor Cm 116 is not connected to the node B will be described. In this case, the capacitance of the node B may include a capacitance component generated by p-n junction in the semiconductor region and a parasitic capacitance component of wiring lines. However, the amount of these capacitance components is negligibly small compared to the capacitance value C2 of the second capacitor 123 included in the charge hold region 103. Thus, C1/(C1+C2) is almost zero. Thus, even if the voltage Vd of the node C is changed, the voltage of the node B hardly changes. In this case, the potential slope is not inverted and a possibility that some of the holes held as signal charges are not discharged arises. In contrast, according to this embodiment, the signal charges that are not discharged can be reduced and thus noise can be reduced.

Next, a description will be given of a relationship among the capacitance value C1 of the first capacitor Cm 116, the capacitance value C2 of the second capacitor 123 included in the charge hold region 103, and the voltages supplied to the individual portions.

In this embodiment, the charge hold region 103 includes the blocking layer 107, the semiconductor layer 108, and the insulating layer 109. The blocking layer 107 has a higher conductivity than the semiconductor layer 108 and the insulating layer 109. Thus, the capacitance value C2 of the second capacitor 123 included in the charge hold region 103 corresponds to the composite capacitance of a capacitance component Ci in the semiconductor layer 108 and a capacitance component Cins in the insulating layer 109. Specifically, the capacitance value C2 of the second capacitor 123 is expressed by the following expression (1).

$$C2 = Ci \times Cins/(Ci+Cins) \qquad (1)$$

With use of an area Ss of the electrode P 110 in plan view, a thickness di of the semiconductor layer 108, a thickness dins of the insulating layer 109, a relative permittivity Ei of the semiconductor layer 108, a relative permittivity Eins of the insulating layer 109, and a vacuum permittivity E0, the capacitance component Ci and the capacitance component Cins are expressed by the following expressions (2) and (3), respectively.

$$Ci = E0 \times Ei \times Ss/di \qquad (2)$$

$$Cins = E0 \times Eins \times Ss/dins \qquad (3)$$

The fringe electric field of the electrode P 110 is almost negligible, and thus only the area Ss of the electrode P 110 in plan view may be considered as an area to be used for calculating capacitance. The area Ss of the electrode P 110 in plan view is, for example, the area of the electrode P 110 in FIGS. 4A to 4C. In FIG. 5B, the thickness di of the semiconductor layer 108 and the thickness dins of the insulating layer 109 are illustrated.

The capacitance value C1 of the first capacitor Cm 116 is expressed by the following expression (4) by using an area Sd of the electrode 502 or the electrode 503 in plan view, a distance dd between the electrode 502 and the electrode 503, and a permittivity Ed of the insulating layer between the electrode 502 and the electrode 503.

$$C1 = E0 \times Ed \times Sd/dd \qquad (4)$$

In this embodiment, the voltage Vd of the node C is controlled to be the first voltage Vd1 and the second voltage Vd2, and thereby signal charges are accumulated and signal charges are discharged by depleting the semiconductor layer 108. When the capacitance value C1 of the first capacitor Cm 116 and the capacitance value C2 of the second capacitor 123 satisfy the following relationship, charges remaining in the semiconductor layer 108 can be reduced when signal charges are discharged. First, an embodiment in which signal charges are holes will be described.

For simplicity, it is assumed that the capacitance value C1 of the first capacitor Cm 116 is k times the capacitance value C2 of the second capacitor 123. That is, the capacitance value C1 and the capacitance value C2 have the relationship expressed by the following expression (5).

$$C1 = k \times C2 \qquad (5)$$

As described above, the amount of change dVd in the voltage of the node C and the amount of change dVB in the voltage of the electrode M 112 (node B) have the relationship expressed by the following expression (6).

$$dVB = dVd \times C1/(C1+C2) \qquad (6)$$

From expressions (5) and (6), expression (7) is obtained.

$$dVB = dVd \times k/(1+k) \qquad (7)$$

To accumulate holes as signal charges, the voltage Vs supplied to the upper electrode S 106 (node A) and the reset voltage Vres may satisfy the relationship expressed by expression (8).

$$Vs > Vres \qquad (8)$$

To transfer holes as signal charges, the voltage Vs of the upper electrode S 106 (node A), the reset voltage Vres, and the amount of change dVB in the voltage of the electrode M 112 may satisfy the relationship expressed by expression (9).

$$Vs < Vres + dVB \quad (9)$$

When the relationship expressed by expression (8) is satisfied, a potential slope for causing holes to drift toward the insulating layer 109 can be formed in the semiconductor layer 108. When the relationship expressed by expression (9) is satisfied, the potential slope in the semiconductor layer 108 can be easily inverted.

From expressions (7) and (9), expression (10) is obtained.

$$Vs - Vres < dVd \times k/(1+k) \quad (10)$$

In the embodiment in which signal charges are holes, the second voltage Vd2 is higher than the first voltage Vd1. That is, the amount of change in the voltage of the node C expressed by dVd=Vd2−Vd1 is a positive value. Thus, the inequality sign is not reversed even if both sides of expression (10) are divided by dVd.

Therefore, regarding the capacitance ratio k of the capacitance value C1 to the capacitance value C2, the following relational expression (11) is obtained from expression (10).

$$1 - \frac{1}{1+k} > \frac{Vs - Vres}{dVd} \quad (11)$$

When the relationship expressed by expression (11) is satisfied, the charges that are not discharged can be reduced. Accordingly, noise can be reduced.

Specifically, in this embodiment, the capacitance value C1 of the first capacitor Cm 116 is 4 fF, and the capacitance value C2 of the second capacitor 123 is 1 fF. That is, k=4. With this configuration, noise can be further reduced.

In this embodiment, the area Sd of either of the electrode 502 and the electrode 503 of the first capacitor Cm 116 and the area Ss of the electrode M 112 in plan view satisfy the relationship expressed by Sd>0.5×Ss. With this configuration, the relationship of the above-described capacitance ratio can be easily obtained.

The effect of reducing noise increases as the value of k increases. Thus, when the capacitance value C1 of the first capacitor Cm 116 is equal to or larger than the capacitance value C2 of the second capacitor 123, the effect of reducing noise can be further enhanced.

The amount of change dVd in the voltage of the node C is expressed by dVd=Vd2−Vd1 by using the first voltage Vd1 and the second voltage Vd2. The left side of expression (11) can be rewritten to C1/(C1+C2) by using expression (5). Thus, expression (11) is modified into expression (12).

$$\frac{C1}{C1+C2} > \frac{Vs - Vres}{Vd2 - Vd1} \quad (12)$$

Next, an embodiment in which signal charges are electrons will be described. In a case where signal charges are electrons, the inequality signs in expressions (8) and (9) are reversed. Thus, the inequality sign in expression (10) is also reversed. That is, in a case where signal charges are electrons, the following expression (13) is obtained.

$$Vs - Vres > dVd \times k/(1+k) \quad (13)$$

However, in the embodiment in which signal charges are electrons, the second voltage Vd2 is lower than the first voltage Vd1. That is, the amount of change dVd in the voltage of the node C expressed by dVd=Vd2−Vd1 is a negative value. Thus, when both sides of expression (13) are divided by dVd, the inequality sign is reversed. As a result, expressions (11) and (12) are obtained as in the case where signal charges are holes.

Now, the relationship expressed by expression (12) will be described. The value on the right side decreases as the difference between the reset voltage Vres and the voltage Vs supplied to the upper electrode S 106 in the charge hold region 103 decreases. That is, even if the capacitance value C1 of the first capacitor Cm 116 is small, the potential slope of the semiconductor layer 108 can be inverted. When the difference between the reset voltage Vres and the voltage Vs supplied to the upper electrode S 106 is small, the amount of charges accumulated in the semiconductor layer 108 decreases.

On the other hand, the value on the right side increases as the difference between the reset voltage Vres and the voltage Vs increases. That is, a large value is used as the capacitance value C1 of the first capacitor Cm 116. In this case, since the difference between the reset voltage Vres and the first voltage Vs1 is large, the amount of charges accumulated in the semiconductor layer 108 can be increased.

As described above, in accordance with the relationship between the capacitance value C1 of the first capacitor Cm 116 and the capacitance value C2 of the second capacitor 123 included in the charge hold region 103, noise can be reduced.

The values described above are merely examples, and the embodiment is not limited to these values. There is a possibility that a defect level exists at the interface between the semiconductor layer 108 and the insulating layer 109. In such a case, a flat band voltage may be considered on the basis of the related art.

Figure 8:
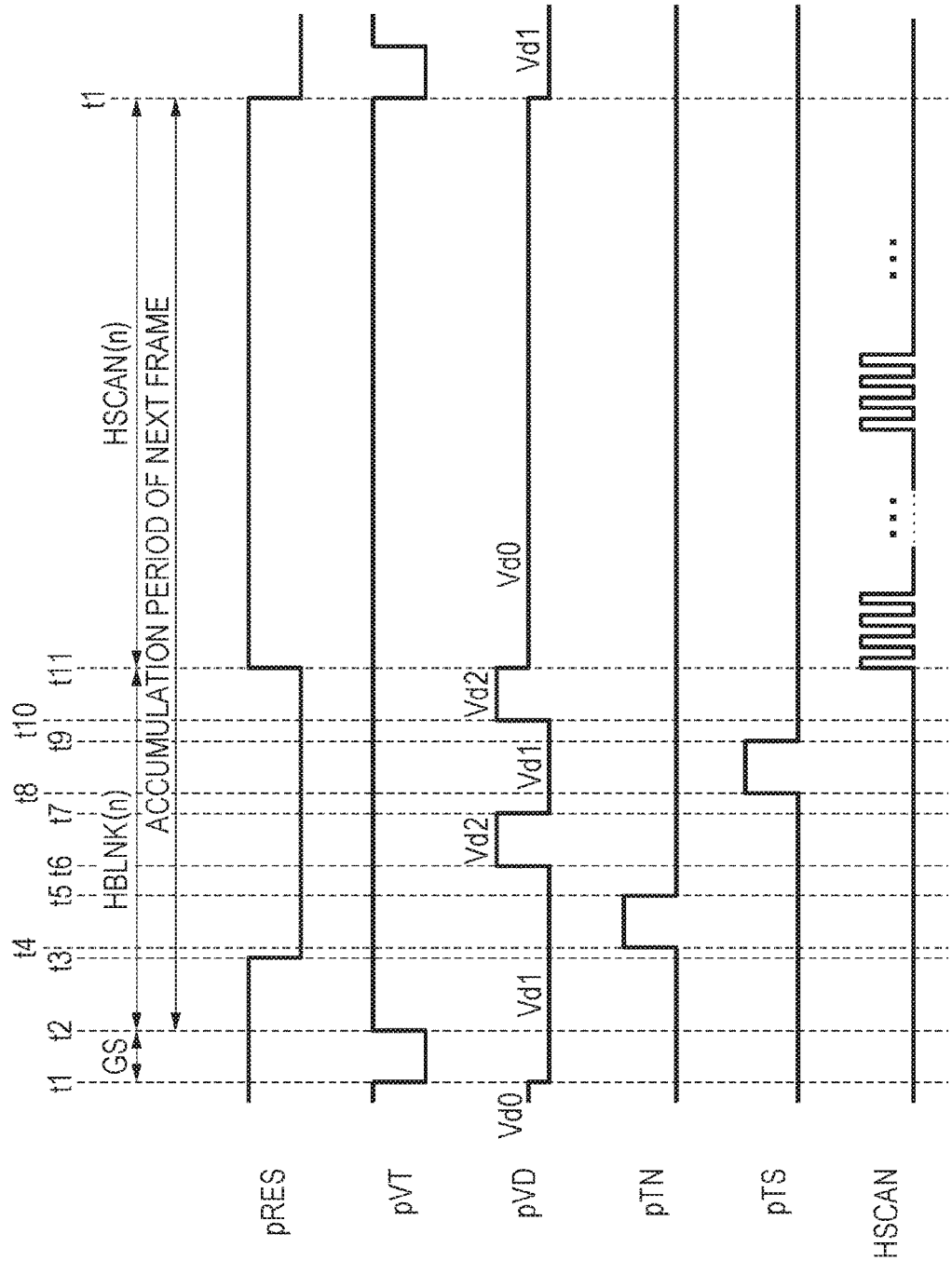
FIG. 8 is a timing chart of drive signals used in the image pickup device.
Figure 9:
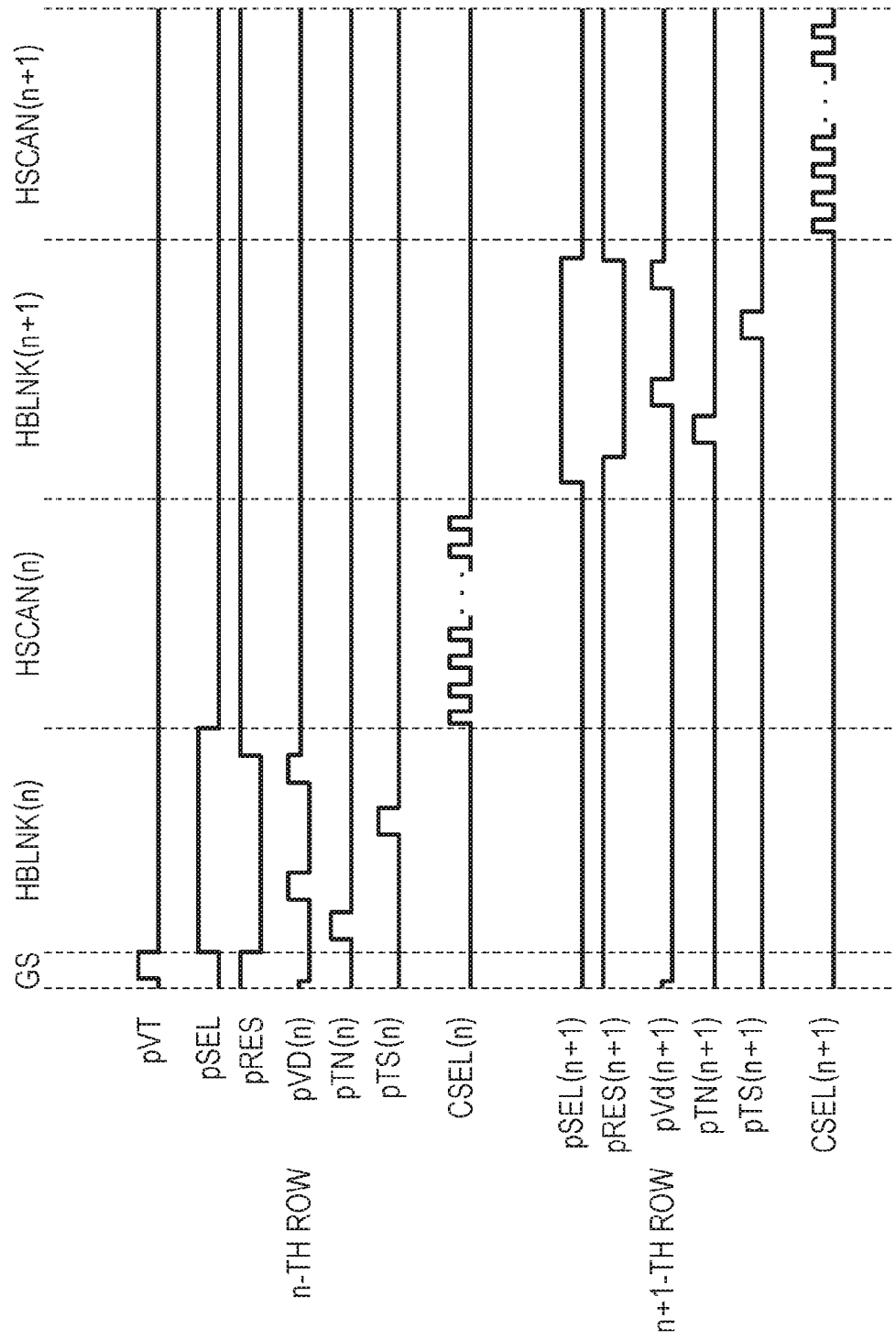
FIG. 9 is a timing chart of drive signals used in the image pickup device.

Next, drive signals used to control the image pickup device according to this embodiment will be described. FIGS. 8 and 9 are timing charts of drive signals that are used in the image pickup device according to this embodiment. FIG. 8 illustrates drive signals corresponding to a signal read operation in one row. FIG. 9 illustrates drive signals corresponding to a signal read operation in two rows, the n-th row and the n+1-th row.

The drive signal pSEL is supplied to the gate of the selection transistor 119. The drive signal pRES is supplied to the gate of the reset transistor 117. The drive signal pVT is supplied to the transfer electrode T 111. The drive signal pTS is supplied to the S/H switch 302. The drive signal pTN is supplied to the S/H switch 303. The drive signal CSEL is supplied to the column drive circuit 202.

When the drive signals pSEL, pRES, pTN, and pTS are at high level, the corresponding transistors or switches are turned on. When the drive signals pSEL, pRES, pTN, and pTS are at low level, the corresponding transistors or switches are turned off. The high level and low level of these drive signals are set in accordance with a threshold voltage of the corresponding transistors or switches. FIG. 8 illustrates the timing chart of the drive signal pVD. The drive signal pVD includes an initial voltage Vd0, the first voltage Vd1, and the second voltage Vd2.

The image pickup device according to this embodiment performs a so-called global electronic shutter operation. The details will be described with reference to FIG. 8. A period GS from time t1 to time t2 is a period of collective charge transfer. A period HBLNK(n) from time t2 to time t11 is a horizontal blanking period. A period HSCAN(n) from time t11 to time t1 is a horizontal scanning period.

At time t1, the voltage of the drive signal pVT is changed from 6 V to 3 V in all the pixels. At the same time, the voltage of the drive signal pVD is changed from the initial voltage Vd0 (=3 V) to the first voltage Vd1 (=2 V) in all the pixels. Accordingly, the signal charges in the light receiving region 101 are collectively transferred to the charge hold region 103 in all the pixels. At time t2, the voltage of the drive signal pVT is changed from 3 V to 6 V in all the pixels, and thereby charge transfer is finished.

Until time t3, the drive signal pRES(n) is kept at the high level, and the reset transistors 117 of the pixels 100 in the n-th row are in an ON-state. The voltages of the nodes B of the pixels 100 in the n-th row are reset to the reset voltage Vres. After that, at time t3, the drive signal pRES(n) is changed to the low level, and accordingly the reset transistors 117 are turned off.

Subsequently, the drive signal pTN(n) is changed to the high level at time t4 and is changed to the low level at time t5. Accordingly, the noise signal N including reset noise (kTC illustrated in FIG. 7) is held in the capacitor CTN of the column circuit 204.

At time t6, the voltage of the drive signal pVD(n) is changed from the first voltage Vd1 (=2 V) to the second voltage Vd2 (=8 V). At time t7, the voltage of the drive signal pVD(n) is changed from the second voltage Vd2 to the first voltage Vd1. With the operation performed from time t6 to time t7, the signal charges held in the charge hold region 103 are discharged, and a voltage Vsig corresponding to the amount of the held signal charges is generated at the node B.

The drive signal pTS(n) is changed to the high level at time t8 and is changed to the low level at time t9. Accordingly, the light signal S including the voltage Vph and reset noise is held in the capacitor CTS of the column circuit 204.

At time t10, the voltage of the drive signal pVD(n) is changed from the first voltage Vd1 to the second voltage Vd2. Accordingly, all the residual charges in the semiconductor layer 108 are discharged, and the light receiving region 101 is reset (film reset). Accordingly, residual charges of the preceding frame can be prevented from affecting the light signal S of the next frame.

At time t11, the drive signal pRES(n) is changed to the high level, and the voltage of the drive signal pVD(n) is changed from the second voltage Vd2 to the initial voltage Vd0. Accordingly, the voltages of the nodes B of the pixels 100 in the n-th row are reset to the reset voltage Vres again (FD reset). The drive signal pRES(n) is kept at the high level until time t3 of the next frame, and the node B is fixed to the reset voltage Vres. After that, the pixels 100 in the n-th row start accumulating signal charges of the next frame.

At time t11, the noise signal N and the light signal S read by the column circuit 204 are output to the output amplifier 122 in each column on the basis of the drive signal CSEL. The output amplifier 122 amplifies the difference between the light signal S and the noise signal N and outputs it to the ADC 205.

After that, as illustrated in FIG. 9, signals are read from the pixels 100 in the n+1-th row. This operation is similar to the operation performed from time t1 to t11 and thus the description thereof is omitted.

As described above, in this embodiment, the light receiving region 101 and the charge hold region 103 are disposed in the continuous portion of the semiconductor layer 108. With this configuration, noise can be reduced.

Second Embodiment

Another embodiment of the present invention will be described. This embodiment is different from the first embodiment in that the charge transfer region 102, the transfer electrode T 111, and the power supply VT 114 connected to the transfer electrode T 111 are omitted. Hereinafter, the difference from the first embodiment will be described.

Figure 10:
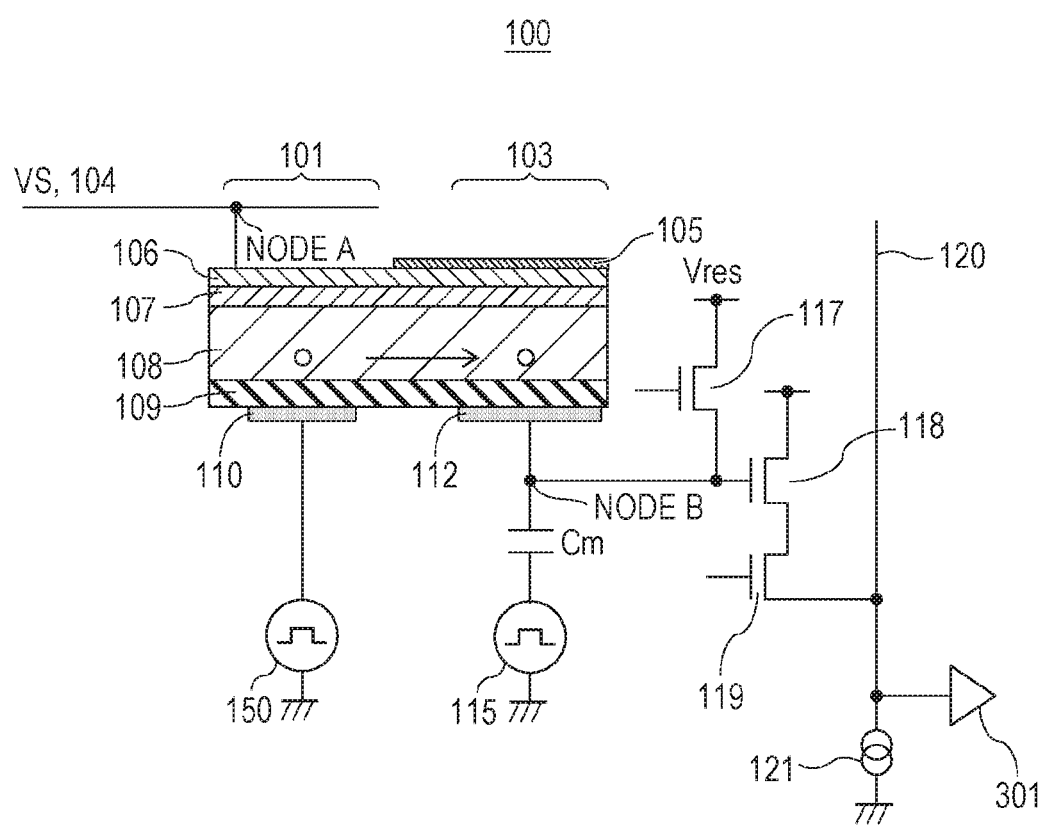
FIG. 10 schematically illustrates the configuration of a pixel of an image pickup device.

FIG. 10 schematically illustrates the pixel 100 of the image pickup device according to this embodiment. The parts having the same functions as those in FIG. 1A are denoted by the same reference numerals. As illustrated in FIG. 10, the pixel 100 does not include the charge transfer region 102, the transfer electrode T 111, and the power supply VT 114.

In the pixel 100 according to this embodiment, a power supply VP 150 connected to the electrode P 110 supplies a plurality of different voltages to the electrode P 110. With the voltage Vp supplied from the power supply VP 150 and the voltage Vd supplied from the power supply VD 115 being controlled, charges can be transferred from the light receiving region 101 to the charge hold region 103. In a case where signal charges are holes, the relationship between the voltage Vp of the electrode P 110 and the voltage Vm of the electrode M 112 is set to Vp>Vm, and thereby charges are transferred from the light receiving region 101 to the charge hold region 103. In the period when charges are accumulated in the light receiving region 101, the relationship between the voltage Vp of the electrode P 110 and the voltage Vm of the electrode M 112 is set to Vp<Vm. In a case where signal charges are electrons, the relationship between the voltage Vp of the electrode P 110 and the voltage Vm of the electrode M 112 is set to Vp<Vm, and thereby charges are transferred from the light receiving region 101 to the charge hold region 103. In the period when charges are accumulated in the light receiving region 101, the relationship between the voltage Vp of the electrode P 110 and the voltage Vm of the electrode M 112 is set to Vp>Vm.

As described above, in this embodiment, the pixel 100 does not include the charge transfer region 102. With this configuration, the size of the pixel can be reduced.

Third Embodiment

Another embodiment of the present invention will be described. This embodiment is different from the first embodiment in that the voltage Vt of the transfer electrode T 111 is fixed and that a plurality of different voltages are supplied to the electrode P 110. Hereinafter, the difference from the first embodiment will be described.

Figure 11:
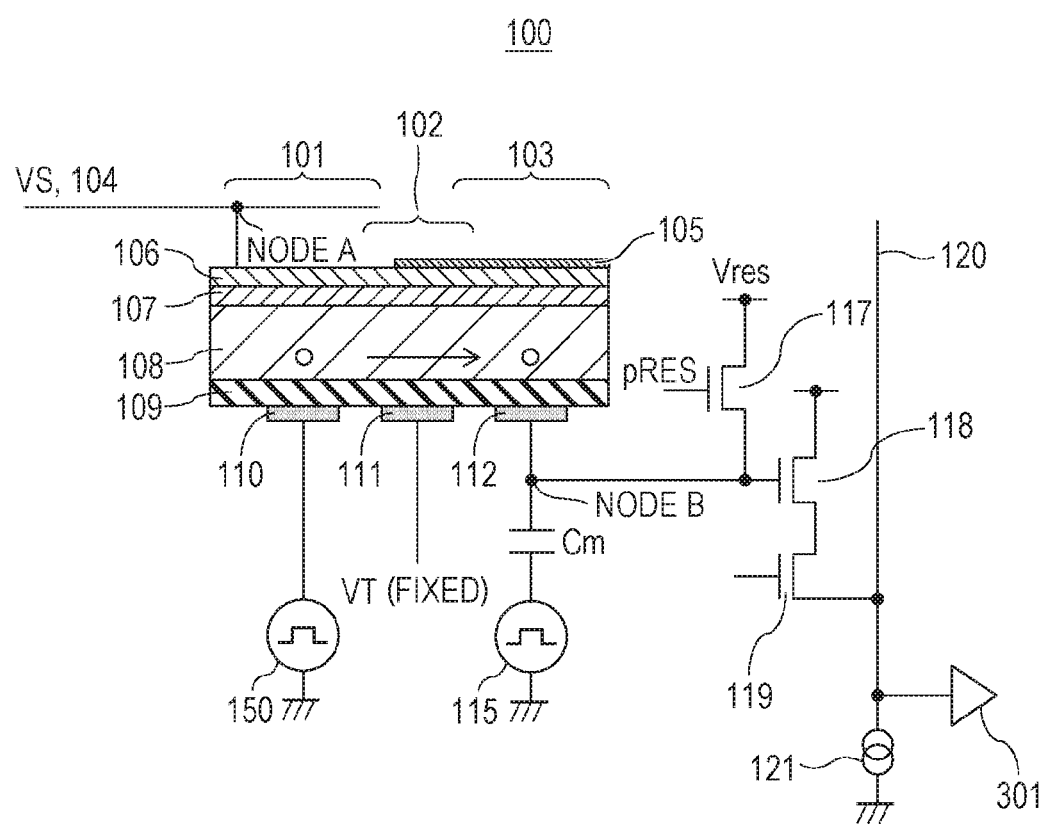
FIG. 11 schematically illustrates the configuration of a pixel of an image pickup device.

FIG. 11 schematically illustrates the pixel 100 of the image pickup device according to this embodiment. The parts having the same functions as those in FIG. 1A are denoted by the same reference numerals. The voltage Vt supplied to the transfer electrode T 111 is fixed. The power supply VP 150 connected to the electrode P 110 supplies a plurality of different voltages to the electrode P 110.

In this embodiment, with the voltage Vp supplied from the power supply VP 150 and the voltage Vd supplied from the power supply VD 115 being controlled, charges can be transferred from the light receiving region 101 to the charge hold region 103. In a case where signal charges are holes, the relationship among the voltage Vp of the electrode P 110, the voltage Vt of the transfer electrode T 111, and the voltage Vm of the electrode M 112 is set to Vp>Vt>Vm, and thereby charges are transferred from the light receiving region 101 to the charge hold region 103. In the period when charges are accumulated in the light receiving region 101, the relationship between the voltage Vp and the voltage Vt is set to Vp<Vt. In a case where signal charges are electrons, the relationship among the voltage Vp of the electrode P 110, the voltage Vt of the transfer electrode T 111, and the voltage Vm of the electrode M 112 is set to Vp<Vt<Vm, and thereby charges are transferred from the light receiving region 101 to the charge hold region 103. In the period when charges are accumulated in the light receiving region 101, the relationship between the voltage Vp and the voltage Vt is set to Vp>Vt.

With the configuration according to this embodiment, reading of signals based on the charges in the charge hold region 103 (step m4 in the first embodiment) and discharging of charges from the light receiving region 101 (film reset in the first embodiment) can be performed in parallel.

Fourth Embodiment

Another embodiment of the present invention will be described. This embodiment is different from the first embodiment in that a plurality of different voltages are supplied to the electrode P 110. Hereinafter, the difference from the first embodiment will be described.

Figure 12:
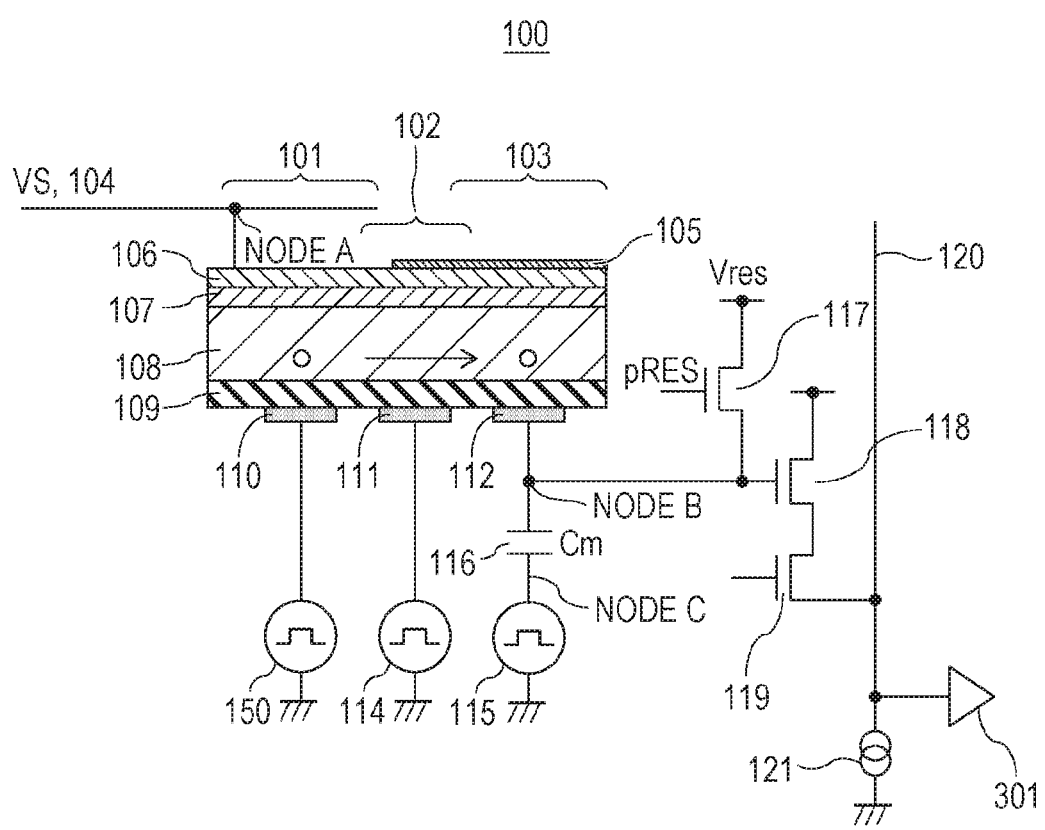
FIG. 12 schematically illustrates the configuration of a pixel of an image pickup device.

FIG. 12 schematically illustrates the pixel 100 of the image pickup device according to this embodiment. The parts having the same functions as those in FIG. 1A are denoted by the same reference numerals. The power supply VP 150 connected to the electrode P 110 supplies a plurality of different voltages to the electrode P 110.

In this embodiment, with the voltage Vp supplied from the power supply VP 150, the voltage Vt supplied from the power supply VT 114, and the voltage Vd supplied from the power supply VD 115 being controlled, charges can be transferred from the light receiving region 101 to the charge hold region 103. In a case where signal charges are holes, the relationship among the voltage Vp of the electrode P 110, the voltage Vt of the transfer electrode T 111, and the voltage Vm of the electrode M 112 is set to Vp>Vt>Vm, and thereby charges are transferred from the light receiving region 101 to the charge hold region 103. In the period when charges are accumulated in the light receiving region 101, the relationship between the voltage Vp and the voltage Vt is set to Vp<Vt. In a case where signal charges are electrons, the relationship among the voltage Vp of the electrode P 110, the voltage Vt of the transfer electrode T 111, and the voltage Vm of the electrode M 112 is set to Vp<Vt<Vm, and thereby charges are transferred from the light receiving region 101 to the charge hold region 103. In the period when charges are accumulated in the light receiving region 101, the relationship between the voltage Vp and the voltage Vt is set to Vp>Vt.

With the configuration according to this embodiment, the potential is easily controlled during transfer of charges. Also, with the configuration according to this embodiment, reading of signals based on the charges in the charge hold region 103 (step m4 in the first embodiment) and discharging of charges from the light receiving region 101 (film reset in the first embodiment) can be performed in parallel.

Fifth Embodiment

Another embodiment of the present invention will be described. This embodiment is different from the first embodiment in the shapes of the electrode P 110, the transfer electrode T 111, and the electrode M 112 in plan view. Hereinafter, the difference from the first embodiment will be described.

Figure 13A:
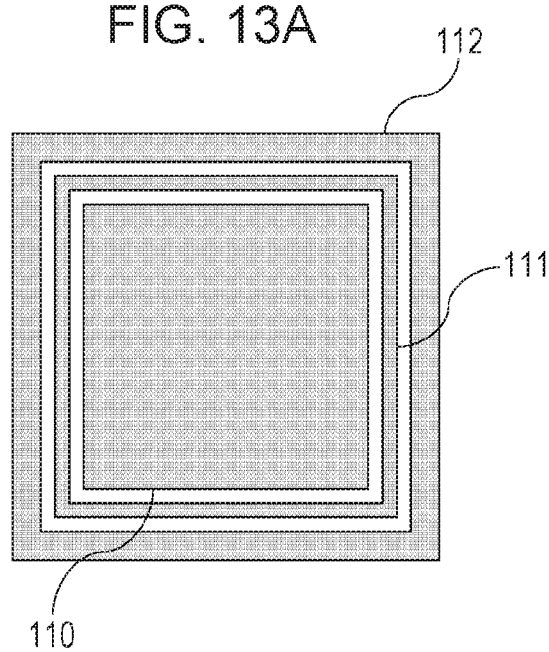
FIG. 13A schematically illustrates a plane structure of an image pickup device, and FIG. 13B schematically illustrates a plane structure of an image pickup device.
Figure 13B:
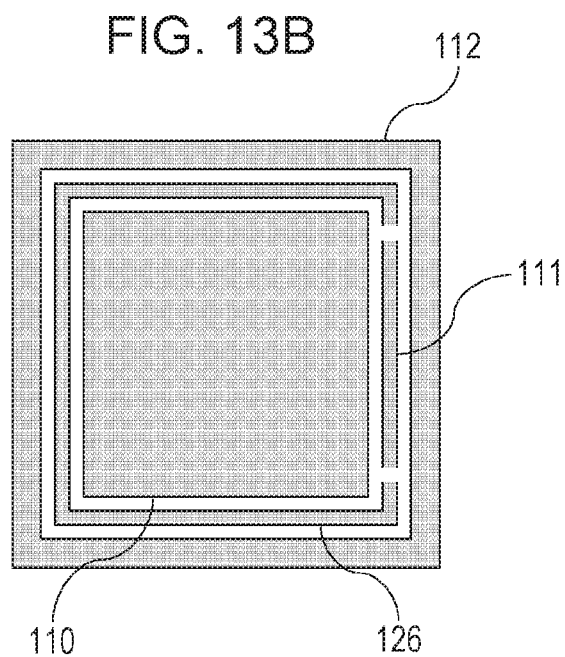

The plane structure of the image pickup device according to this embodiment will be described. FIGS. 13A and 13B schematically illustrate the plane structure of the image pickup device. The same parts as those in FIGS. 1A to 1C are denoted by the same reference numerals.

As illustrated in FIG. 13A, the electrode P 110 has a rectangular shape. The transfer electrode T 111 surrounds the electrode P 110 in plan view. Furthermore, the electrode M 112 surrounds the transfer electrode T 111 in plan view. With this configuration, a rectangular opening to the light receiving region 101 can be formed. As a result, the sensitivity can be increased.

A modification example of this embodiment will be described. As illustrated in FIG. 13B, the transfer electrode T 111 and an isolation electrode 126 are disposed between the electrode P 110 and the electrode M 112. A fixed voltage is supplied to the isolation electrode 126. With the isolation electrode 126, diffusion of charges can be suppressed. As a result, the sensitivity can be increased.

As described above, according to this embodiment, the sensitivity can be increased.

Sixth Embodiment

Another embodiment of the present invention will be described. This embodiment is different from the first embodiment in that a plurality of light receiving regions 101 share the charge hold region 103. Hereinafter, the difference from the first embodiment will be described.

Figure 14A:
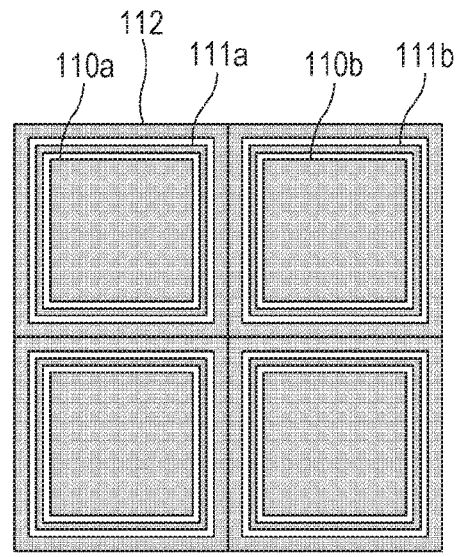
FIG. 14A schematically illustrates a plane structure of an image pickup device, and FIG. 14B schematically illustrates the configuration of a pixel of the image pickup device.
Figure 14B:
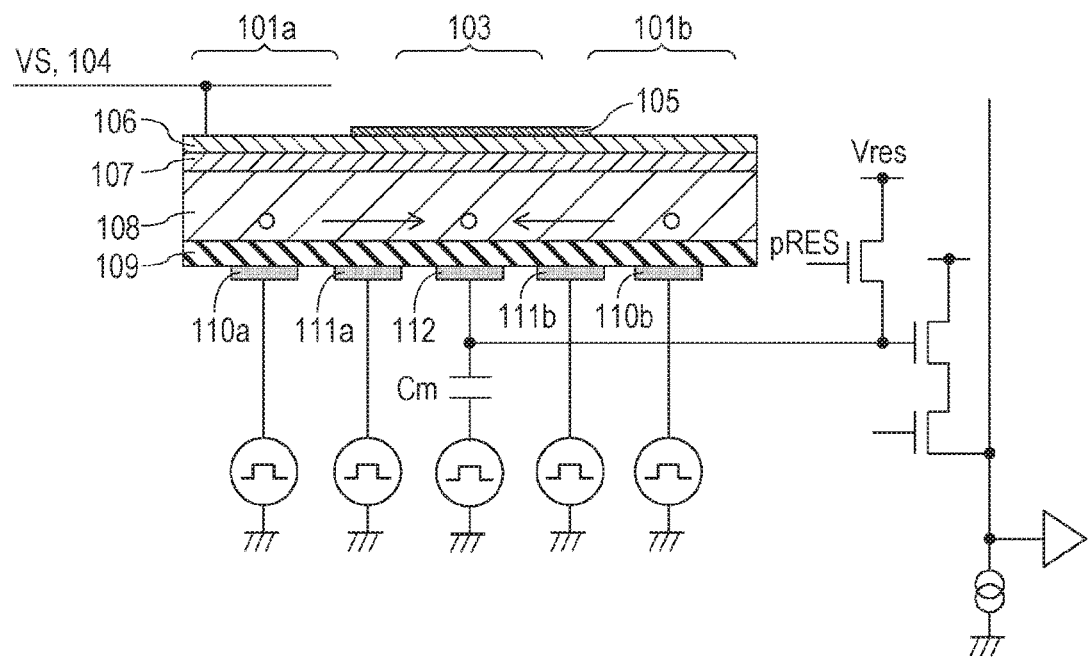

FIG. 14A schematically illustrates the plane structure of the image pickup device. FIG. 14B schematically illustrates the pixel 100 of the image pickup device according to this embodiment. In FIGS. 14A and 14B, an alphabetic character is attached after the reference numeral to distinguish the plurality of light receiving regions 101 from each other. The same applies to a plurality of electrodes P 110 and a plurality of transfer electrodes T 111.

In this embodiment, the charges in the light receiving region 101a and the charges in the light receiving region 101b are transferred to the charge hold region 103. From another point of view, a plurality of light receiving regions 101 are arranged for a set of the pixel circuit and the charge hold region 103. Thus, a plurality of signals in the plurality of light receiving regions 101 can be read from the same pixel circuit. Alternatively, charges from the plurality of light receiving regions 101 can be added in the charge hold region 103.

Seventh Embodiment

Another embodiment of the present invention will be described. This embodiment is different from the first embodiment in that a plurality of electrodes separated from each other are arranged on the semiconductor layer 108. Hereinafter, the difference from the first embodiment will be described.

Figure 15A:
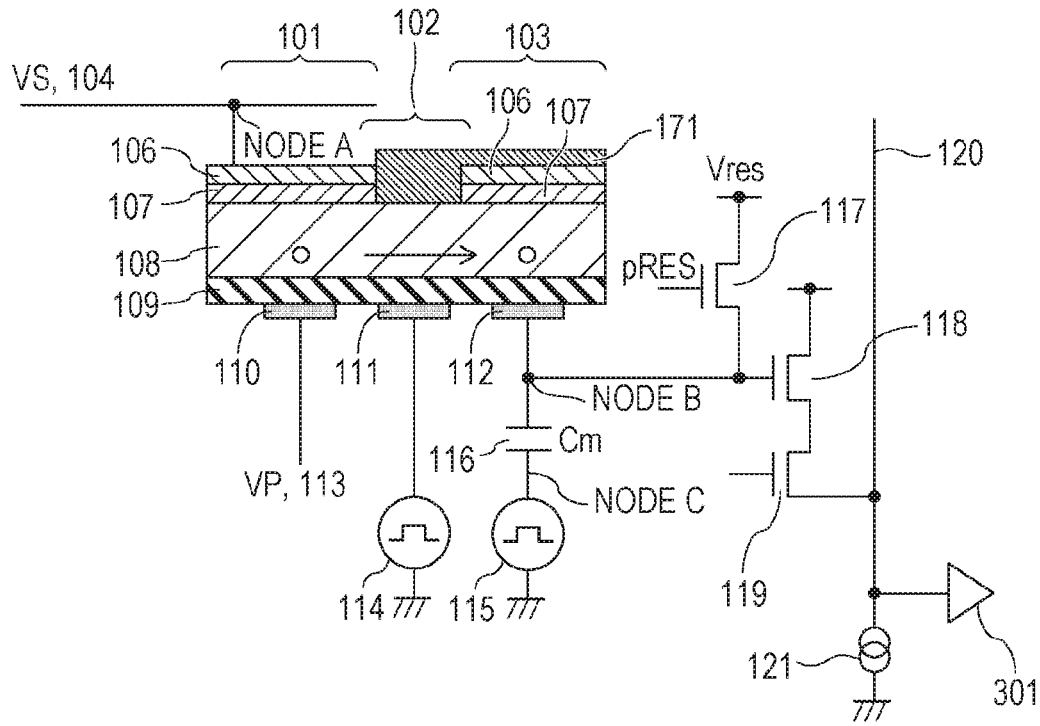
FIG. 15A schematically illustrates the configuration of a pixel of an image pickup device, and FIG. 15B schematically illustrates the configuration of a pixel of an image pickup device.

FIG. 15A schematically illustrates the pixel 100 of the image pickup device according to this embodiment. The parts having the same functions as those in FIG. 1A are denoted by the same reference numerals. The upper electrode S 106 and the blocking layer 107 are not disposed on the charge transfer region 102. Thus, the upper electrode S 106 includes a portion (first electrode) disposed on the light receiving region 101 and a portion (third electrode) disposed on the charge hold region 103, which are isolated from each other. A light shield layer 171 is disposed at a portion between the two isolated portions in the light receiving region 101. The light shield layer 171 is formed of an insulator such as resin. With this configuration, light entering the charge hold region 103 can be reduced.

In a modification example of this embodiment, the light shield layer 171 is formed of a conductive member such as metal. In this case, the upper electrode S 106 is not disposed on the charge hold region 103. This modification example is illustrated in FIG. 15B.

Figure 15B:
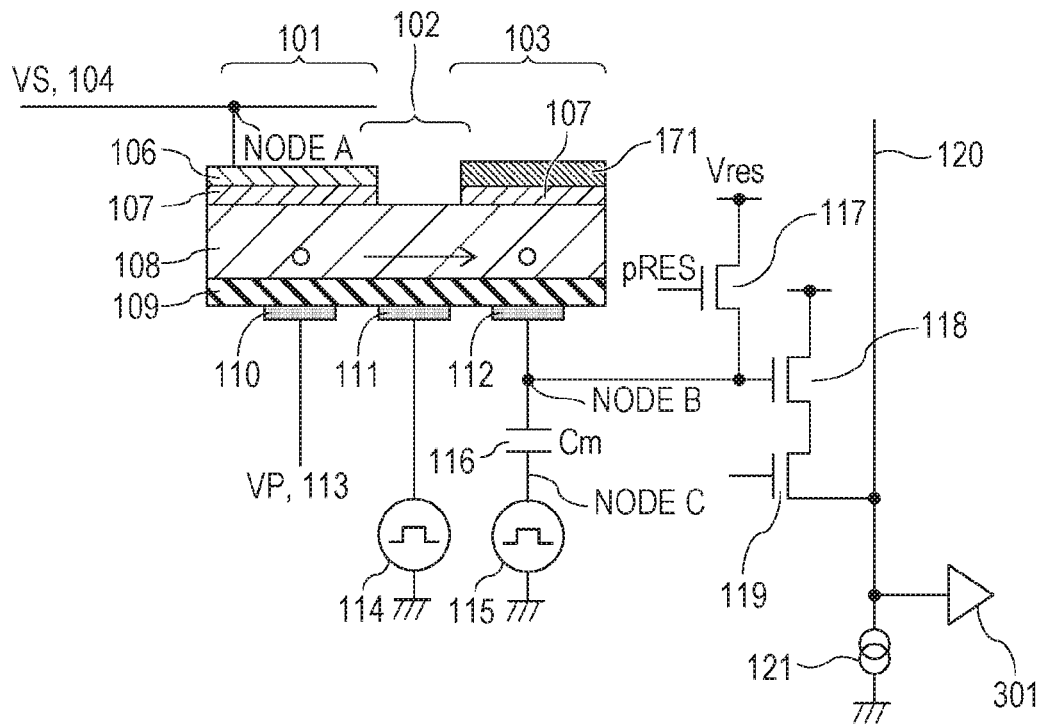

FIG. 15B schematically illustrates the pixel 100 of the image pickup device according to this modification example. The parts having the same functions as those in FIG. 1A are denoted by the same reference numerals. The upper electrode S 106 is not disposed on the charge hold region 103, and the blocking layer 107 and the light shield layer 171 are disposed thereon. The light shield layer 171 is formed of a conductive member such as metal. Thus, the light shield layer 171 applies a bias voltage to the charge hold region 103. With this configuration, the light shield layer 171 functions as an electrode (third electrode) capable of reducing light entering the charge hold region 103.

In this embodiment, the light transmittance of the upper electrode S 106 disposed in the light receiving region 101 is higher than the light transmittance of the light shield layer 171. With this configuration, the light receiving region 101 that receives light and the charge hold region 103 that is shielded against light can be provided in the semiconductor layer 108. Alternatively, the upper electrode S 106 and the light shield layer 107 may be electrically connected to each other. With this configuration, the resistance of the upper electrode S 106 can be effectively reduced and thus the operation speed can be increased.

Figure 16:
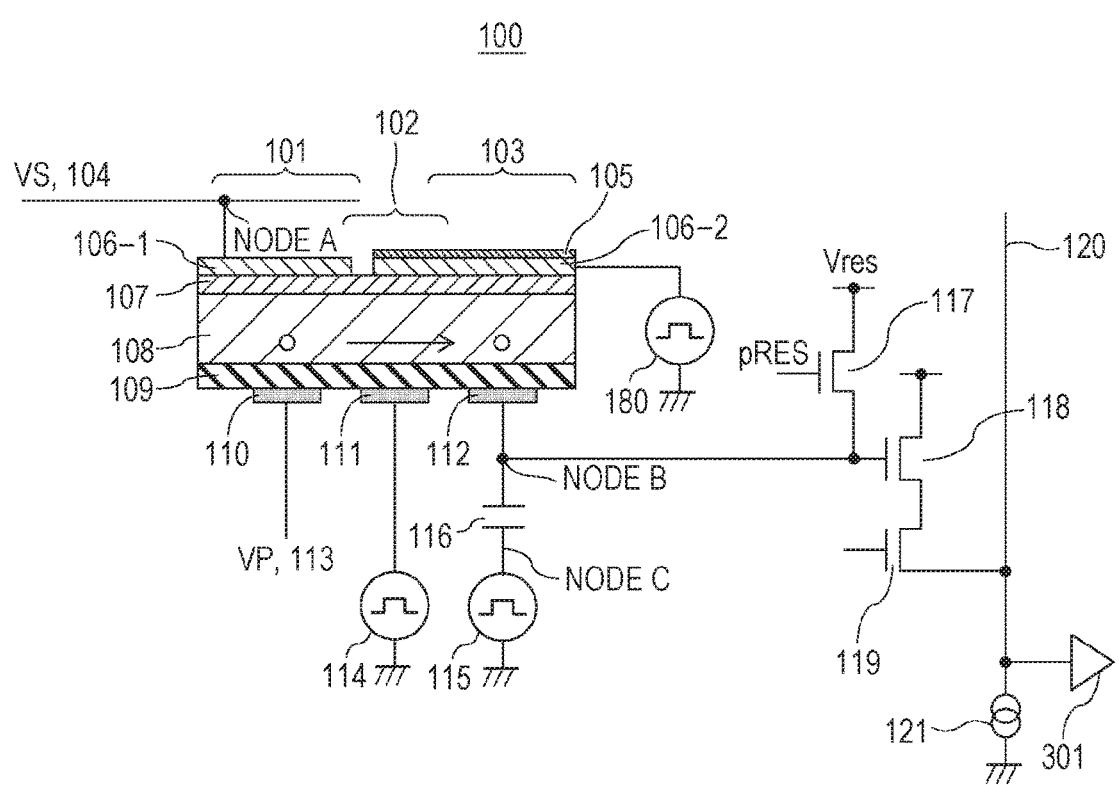
FIG. 16 schematically illustrates the configuration of a pixel of an image pickup device.

Another modification example of this embodiment is illustrated in FIG. 16. FIG. 16 schematically illustrates the pixel 100 of the image pickup device according to this modification example. The parts having the same functions as those in FIG. 1A are denoted by the same reference numerals. In the image pickup device illustrated in FIG. 16, the upper electrode S 106 includes a portion (first electrode) disposed on the light receiving region 101 and a portion (third electrode) disposed on the charge hold region 103, which are isolated from each other. At a portion between the two isolated portions in the light receiving region 101, the light shield layer 171 is not disposed. The two isolated portions in the light receiving region 101 are referred to as a first electrode 106-1 and a third electrode 106-2, respectively.

The light receiving region 101 is disposed between the first electrode 106-1 and the electrode P (second electrode) 110. The charge hold region 103 is disposed between the third electrode 106-2 and the electrode M (fourth electrode) 112. The first electrode 106-1 is, like the upper electrode S 106 in the first embodiment, connected to the power supply VS 104. The third electrode 106-2 is connected to a power supply VSB 180. The power supply VSB 180 supplies a plurality of voltages Vsb to the third electrode 106-2.

When holes as signal charges are transferred from the light receiving region 101 to the charge hold region 103, the voltage Vs of the first electrode 106-1 and the voltage Vsb of the third electrode 106-2 satisfy the relationship expressed by Vs>Vsb. Accordingly, charge transfer by the electrode P 110, the transfer electrode T 111, and the electrode M 112 can be supported. As a result, charge transfer can be performed at higher speed. In a case where signal charges are electrons, the voltage Vs of the first electrode 106-1 and the voltage Vsb of the third electrode 106-2 satisfy the relationship expressed by Vs<Vsb when charges are transferred. Accordingly, charge transfer by the electrode P 110, the transfer electrode T 111, and the electrode M 112 can be supported. As a result, charge transfer can be performed at higher speed.

An operation of reading signal charges held in the charge hold region 103 includes an operation of discharging charges in the direction perpendicular to the semiconductor layer 108. With the voltage Vsb supplied to the third electrode 106-2 being controlled, the operation of discharging charges can be performed more reliably.

Furthermore, an electrode isolated from the first electrode 106-1 and the third electrode 106-2 may be disposed between the first electrode 106-1 and the third electrode 106-2. That is, an electrode that can be independently controlled may be disposed on the charge transfer region 102. In this case, an electric field formed by the transfer electrode T 111 and the electrode is able to suppress leakage of charges accumulated in the light receiving region 101 to the outside.

Figure 17:
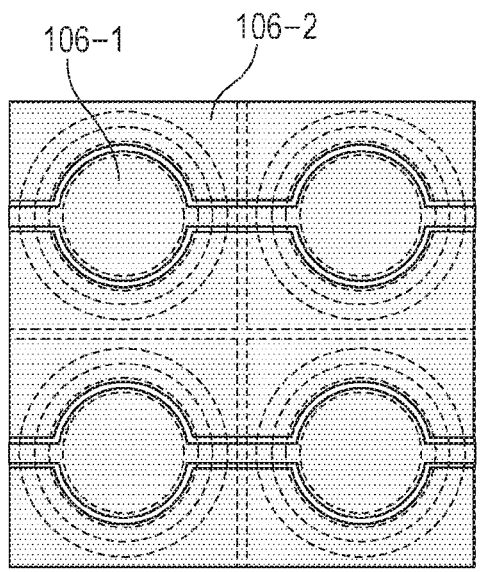
FIG. 17 schematically illustrates a plane structure of an image pickup device.

FIG. 17 schematically illustrates the plane structure of the first electrode 106-1 and the third electrode 106-2. The shapes of the electrode P 110, the transfer electrode T 111, and the electrode M 112 illustrated in FIG. 4A are represented by broken lines.

As described above, in this embodiment, the upper electrode S 106 includes a portion (first electrode) disposed on the light receiving region 101 and a portion (third electrode) disposed on the charge hold region 103, which are isolated from each other. With this configuration, the transfer efficiency of charges can be increased.

Eighth Embodiment

Another embodiment of the present invention will be described. This embodiment is different from the first embodiment in that the semiconductor layer 108 and the electrode M 112 are in contact with each other. Hereinafter, the difference from the first embodiment will be described.

Figure 18:
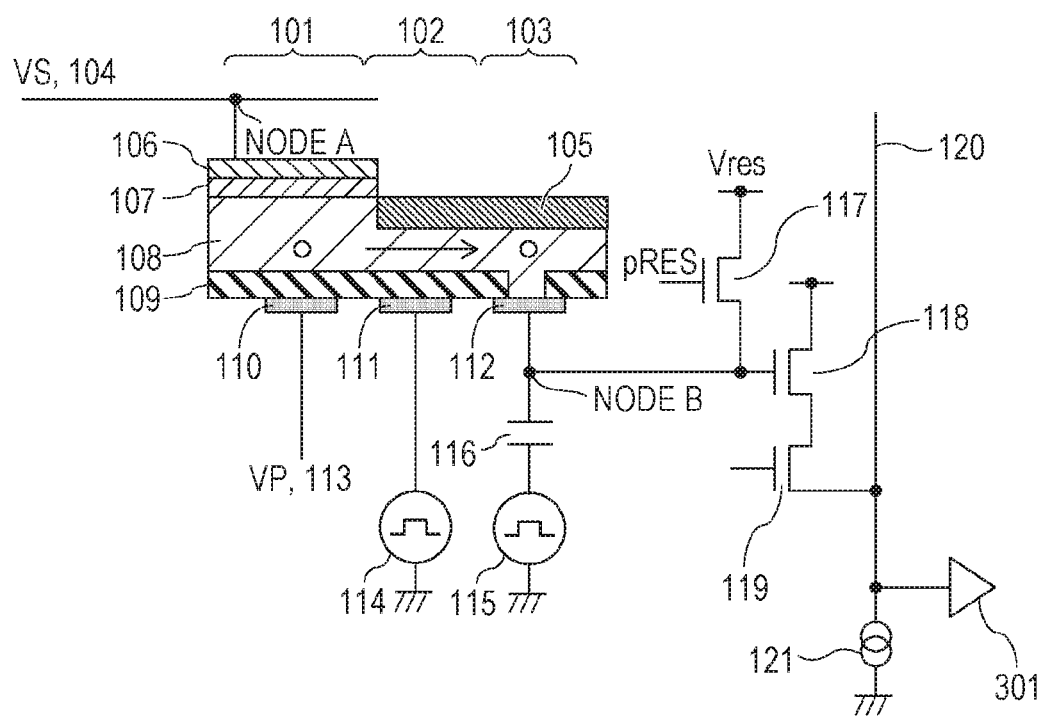
FIG. 18 schematically illustrates the configuration of a pixel of an image pickup device.

FIG. 18 schematically illustrates the pixel 100 of the image pickup device according to this embodiment. The upper electrode S 106 and the blocking layer 107 are not disposed on the charge transfer region 102 and the charge hold region 103. In this embodiment, charge transfer in the charge transfer region 102 is performed at the interface between the semiconductor layer 108 and the insulating layer 109. Thus, the upper electrode S 106 and the blocking layer 107 can be omitted in the charge transfer region 102. Also, the charge hold region 103 is in contact with the electrode M 112. Thus, the charges in the charge hold region 103 can be input to the gate of the amplification transistor 118 via the electrode M 112. With this configuration, the upper electrode S 106 and the blocking layer 107 can be omitted in the charge hold region 103.

In this embodiment, the thickness of the semiconductor layer 108 in the charge transfer region 102 and the charge hold region 103 is smaller than the thickness of the semiconductor layer 108 in the light receiving region 101. Furthermore, with the light shield layer 105 being disposed on the charge transfer region 102 and the charge hold region 103, light entering the charge transfer region 102 and the charge hold region 103 can be reduced.

According to the configuration of this embodiment, noise caused by light incident on the charge transfer region 102 or the charge hold region 103 can be reduced.

Ninth Embodiment

Another embodiment of the present invention will be described. This embodiment is different from the first embodiment in that two sets of the light receiving region 101 and the charge hold region 103 are provided for one microlens 401. According to this embodiment, a function of a phase difference AF can be given to the pixel 100. Hereinafter, the difference from the first embodiment will be described.

Figure 19A:
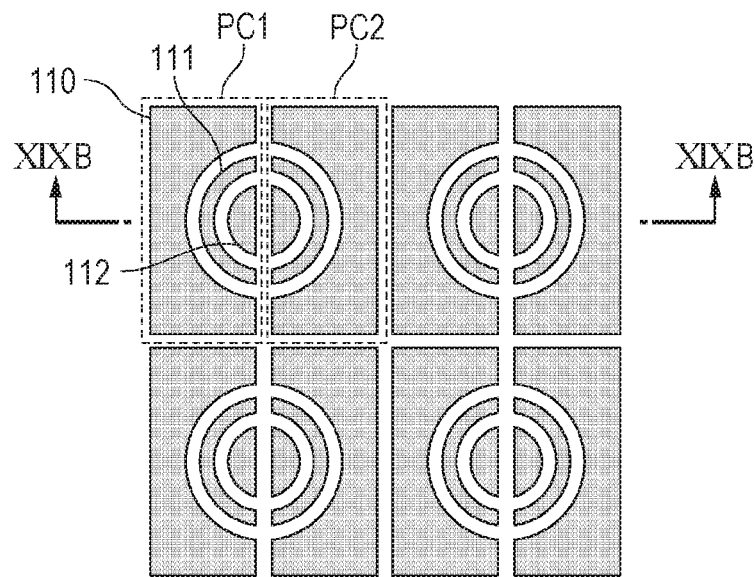
FIG. 19A schematically illustrates a plane structure of an image pickup device, and FIG. 19B schematically illustrates a cross-sectional view of the image pickup device.
Figure 19B:
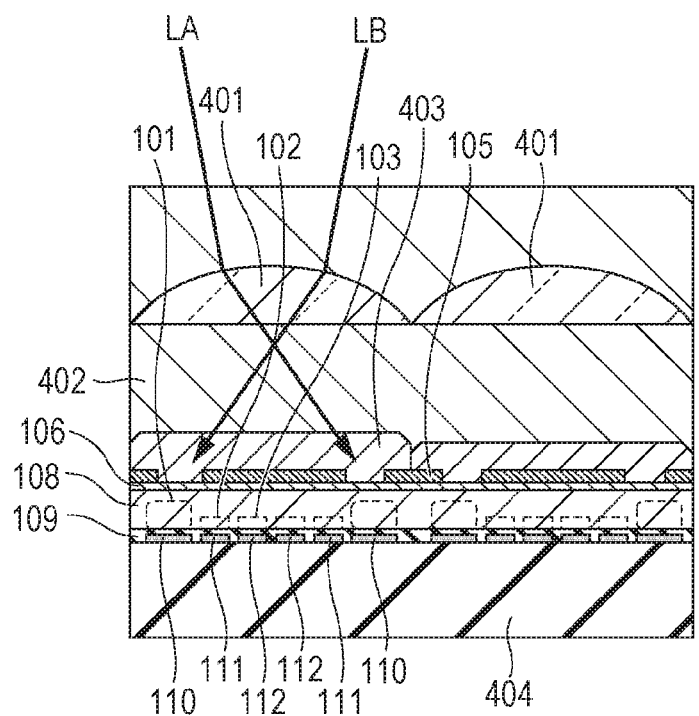

The plane structure and cross-sectional structure of the image pickup device according to this embodiment will be described with reference to the drawings. FIG. 19A schematically illustrates the plane structure of the image pickup device. The same parts as those in FIG. 4A are denoted by the same reference numerals. FIG. 19A illustrates the pixels 100 in the two rows and two columns. FIG. 19A schematically illustrates the arrangement of the electrode P 110, the transfer electrode T 111, and the electrode M 112 in a plane parallel to the surface of the substrate on which the pixel circuit is disposed. FIG. 19B schematically illustrates the cross-sectional structure of the image pickup device. The cross-section illustrated in FIG. 19B corresponds to the cross-section taken along line XIXB-XIXB in FIG. 19A. The same parts as those in FIG. 4B are denoted by the same reference numerals.

In this embodiment, one pixel 100 includes two sub-pixels PC1 and PC2. The two sub-pixels PC1 and PC2 are provided for one microlens 401. That is, the light collected by one microlens 401 enters the two sub-pixels PC1 and PC2.

Each of the sub-pixels PC1 and PC2 has the same configuration as the pixel 100 according to the first embodiment. Thus, the configurations and operations of the sub-pixels PC1 and PC2 are the same as in the first embodiment, and the description thereof is omitted.

The two sub-pixels PC1 and PC2 provided for the same microlens are disposed with a predetermined distance d1 therebetween. Although not illustrated, the pixel electrodes of the pixels 100 adjacent to each other may be disposed with a distance d2, which is larger than the distance d1, therebetween. Such an arrangement of the pixel electrodes can suppress the accumulation of charges generated in accordance with the light entered a certain pixel in the photoelectric conversion portion of an adjacent pixel.

FIG. 19B illustrates the microlens 401, the planarized layer 402, the color filter 403, the light shield layer 105, the upper electrode S 106, the semiconductor layer 108, the insulating layer 109, and the interlayer film 404. The light receiving region 101, the charge transfer region 102, and the charge hold region 103 disposed in the semiconductor layer 108 are represented by broken lines.

FIGS. 19A and 19B illustrate the electrode P 110 corresponding to the light receiving region 101, the transfer electrode T 111 corresponding to the charge transfer region 102, and the electrode M 112 corresponding to the charge hold region 103. The shapes of the electrode P 110, the transfer electrode T 111, and the electrode M 112 are concentric semicircle. In this embodiment, the two sub-pixels PC1 and PC2 are arranged line symmetrically against the line parallel to the surface of the substrate on which the pixel circuit is disposed.

In this embodiment, the charge hold region 103, the charge transfer region 102, and the light receiving region 101 are arranged in order from the position near the center of the microlens 401 in plan view. With this configuration, the performance of separating incident light beams in the two sub-pixels PC1 and PC2 can be increased, as represented by a light beam LA and a light beam LB in FIG. 19B. As a result, focus detection can be accurately performed.

As described above, in this embodiment, the two sub-pixels PC1 and PC2 are provided for one microlens 401. With this configuration, phase difference detection signals with no time difference can be read. Thus, accurate distance information about a subject can be obtained in real time during capturing of a moving image.

The operation of the pixel 100 is not limited to the above-described operation, and an ordinary operation for obtaining a captured image may be performed.

Tenth Embodiment

Another embodiment of the present invention will be described. This embodiment is different from the first to fourth embodiments in that the transfer electrode T 111 is disposed at a height different from the electrode P 110 and the electrode M 112. Hereinafter, the difference from the first to fourth embodiments will be described.

Figure 20:
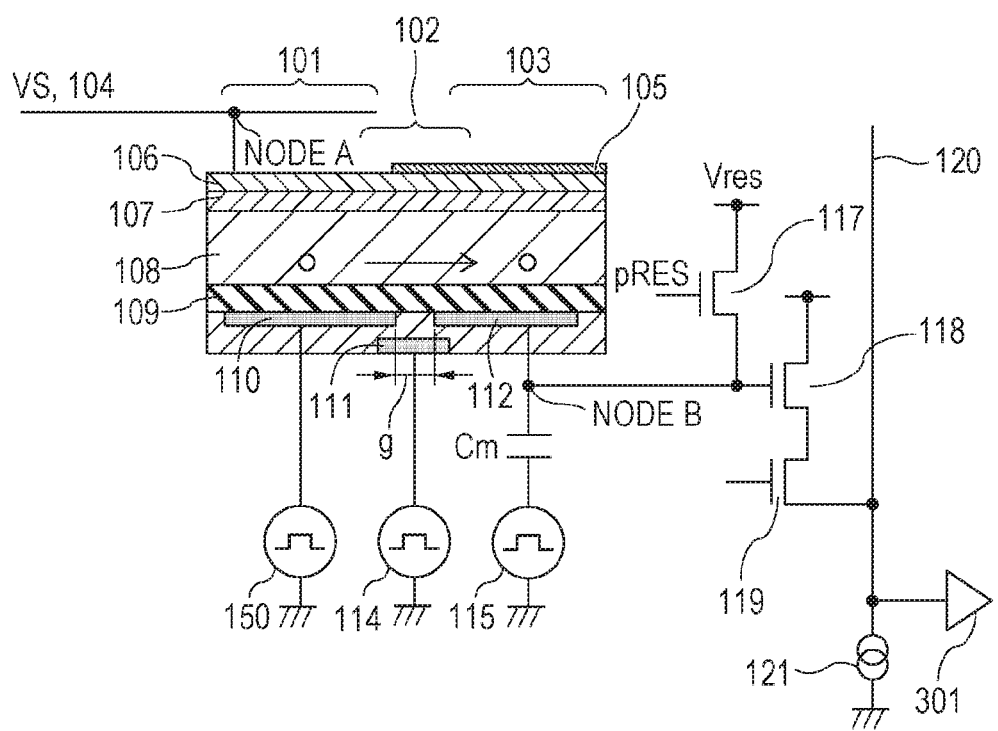
FIG. 20 schematically illustrates the configuration of a pixel of an image pickup device.

FIG. 20 schematically illustrates the pixel 100 of the image pickup device according to this embodiment. The parts having the same functions as those in FIG. 1A or FIG. 12 are denoted by the same reference numerals.

In this embodiment, the electrode P 110 and the electrode M 112 are formed in the same layer. On the other hand, the transfer electrode T 111 is formed in a layer different from the layer of the electrode P 110 and the electrode M 112. With reference to the surface of the substrate on which the pixel circuit is disposed, the transfer electrode T 111 is disposed at a height different from the electrode P 110 and the electrode M 112. Furthermore, part of the transfer electrode T 111 overlaps the electrode P 110 and the electrode M 112.

With this configuration, a gap g between the electrode P 110 and the electrode M 112 can be decreased. The gap g has an influence on the charge transfer characteristic. If the gap g is small, the charge transfer characteristic is enhanced. Thus, according to this embodiment, the transfer efficiency of charges can be increased.

Eleventh Embodiment

Figure 21:
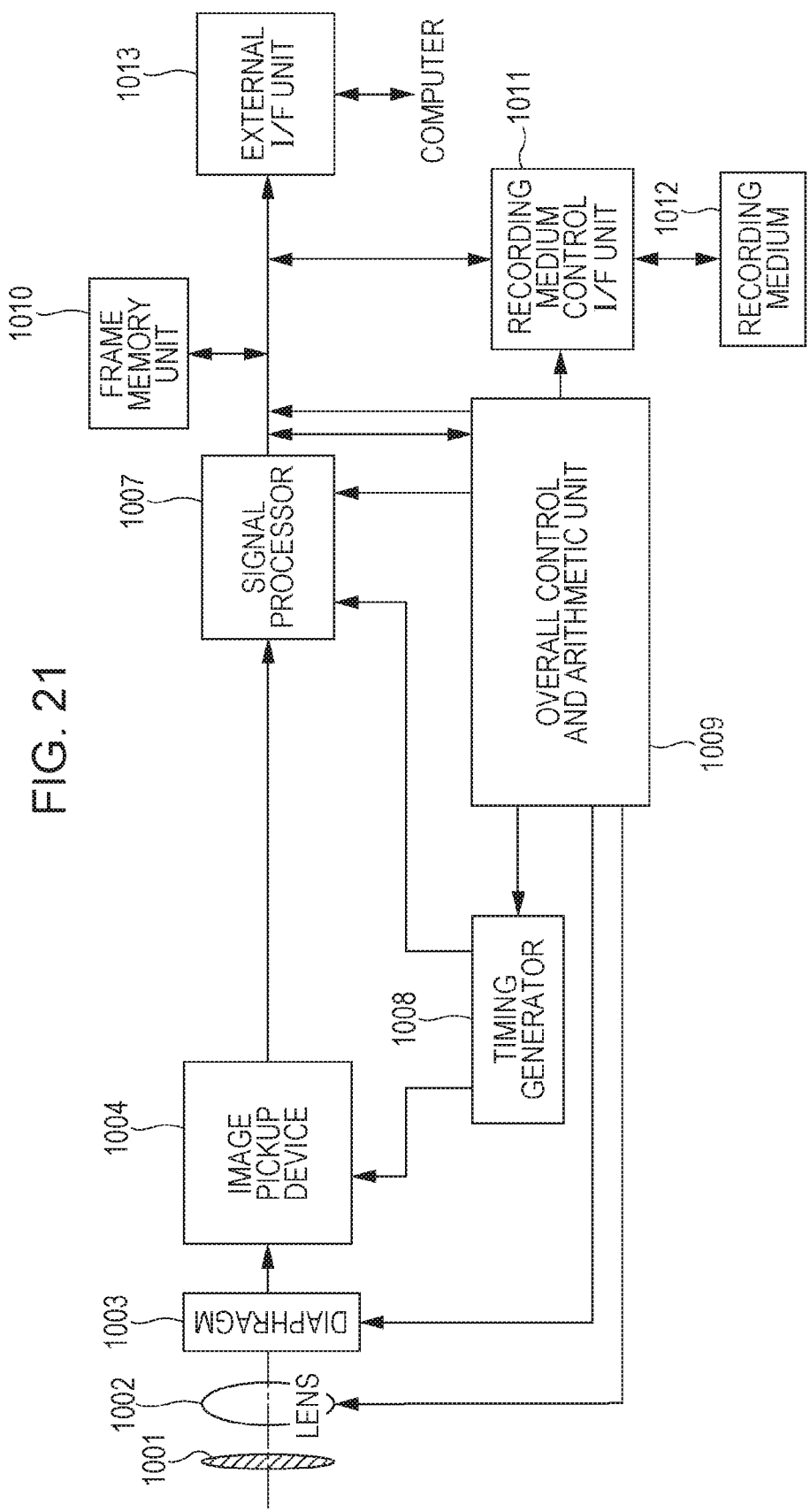
FIG. 21 is a block diagram illustrating an image pickup system.

An image pickup system according to an embodiment of the present invention will be described. Examples of the image pickup system include a digital still camera, a digital camcorder, a camera head, a copier, a facsimile, a mobile phone, an in-vehicle camera, and an observation satellite. FIG. 21 is a block diagram illustrating a digital still camera, which is an example of the image pickup system.

Referring to FIG. 21, a barrier 1001 protects a lens, a lens 1002 forms an optical image of a subject on an image pickup device 1004, and a diaphragm 1003 changes the amount of light passed through the lens 1002. The image pickup device 1004 corresponds to the image pickup devices described above in the individual embodiments and converts the optical image formed by the lens 1002 into image data. Here, it is assumed that an AD converter is formed on the semiconductor substrate of the image pickup device 1004. A signal processor 1007 performs various correction processes on image data output from the image pickup device 1004 and compresses the image data. Also, referring to FIG. 21, a timing generator 1008 outputs various timing signals to the image pickup device 1004 and the signal processor 1007, and an overall control and arithmetic unit 1009 controls the overall digital still camera. A frame memory unit 1010 temporarily stores image data. A recording medium control interface (I/F) unit 1011 is used to record data on and read data from a recording medium. A recording medium 1012 is a removable recording medium, such as a semiconductor memory, on which image data is to be recorded or from which image data is to be read. An external interface (I/F) unit 1013 is used to communicate with an external computer or the like. Here, a timing signal or the like may be input from the outside of the image pickup system. The image pickup system may include at least the image pickup device 1004 and the signal processor 1007 that processes image signals output from the image pickup device 1004.

In this embodiment, the image pickup device 1004 and the AD converter are provided on different semiconductor substrates. Alternatively, the image pickup device 1004 and the AD converter may be formed on the same semiconductor substrate. Alternatively, the image pickup device 1004 and the signal processor 1007 may be formed on the same semiconductor substrate.

The individual pixels 100 may be configured to include a first photoelectric conversion portion 101A and a second photoelectric conversion portion 101B. The signal processor 1007 may be configured to process signals based on charges generated in the first photoelectric conversion portion 101A and signals based on charges generated in the second photoelectric conversion portion 101B and to obtain distance information representing the distance from the image pickup device 1004 to a subject.

In an embodiment of the image pickup system, the image pickup device according to the first embodiment is used as the image pickup device 1004. In this way, with an embodiment of the present invention being applied to the image pickup system, an image with reduced noise can be obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-237867, filed Dec. 4, 2015, which is hereby incorporated by reference herein in its entirety.

What is claimed is:

1. An image pickup device comprising:
a substrate which includes source regions and drain regions of transistors included in a plurality of pixel circuits and disposed in the substrate;
a semiconductor layer disposed on the substrate;
a first electrode disposed on the semiconductor layer;
a second electrode disposed between the semiconductor layer and the substrate;
a third electrode disposed on the semiconductor layer;
a fourth electrode disposed between the semiconductor layer and the substrate; and
an interlayer film including a wiring line provided between the second electrode and the substrate,
wherein a continuous portion of the semiconductor layer includes a light receiving region and a charge hold region,
the light receiving region is configured to generate and accumulate signal charges, the light receiving region being disposed between the first electrode and the second electrode,
the charge hold region is configured to hold signal charges generated in, accumulated in and transferred from the light receiving region, the charge hold region being disposed at a position different from the light receiving region, the charge hold region is disposed between the third electrode and the fourth electrode,
each of the plurality of pixel circuits is configured to read a signal based on a hole generated through photoelectric conversion,
when the hole is transferred from the light receiving region to the charge hold region, a voltage supplied to the second electrode and represented by Vp and a voltage supplied to the fourth electrode and represented by Vm satisfy a relationship expressed by Vp>Vm,
the continuous portion of the semiconductor layer includes a transfer region disposed between the light receiving region and the charge hold region,
the image pickup device further comprises a transfer electrode configured to control a potential of the transfer region,
when the hole is accumulated in the light receiving region, the voltage supplied to the second electrode and represented by Vp and a voltage supplied to the transfer electrode and represented by Vt satisfy a relationship expressed by Vp<Vt, and
when the hole is transferred from the light receiving region to the charge hold region, the voltage represented by Vp, the voltage represented by Vt, and the voltage supplied to the fourth electrode and represented by Vm satisfy a relationship expressed by Vp>Vt>Vm.

2. The image pickup device according to claim 1, further comprising:
a first insulating layer disposed between the light receiving region and the second electrode.

3. The image pickup device according to claim 1, further comprising:
a second insulating layer disposed between the charge hold region and the fourth electrode.

4. The image pickup device according to claim 1, wherein the fourth electrode is disposed to surround the second electrode in a plane parallel to a surface of the substrate.

5. The image pickup device according to claim 1, wherein the continuous portion of the semiconductor layer includes a transfer region disposed between the light receiving region and the charge hold region, and
the image pickup device further comprises a transfer electrode configured to control a potential of the transfer region.

6. The image pickup device according to claim 1, wherein each of the plurality of pixel circuits includes an amplification transistor configured to output a signal based on the charge generated in the light receiving region.

7. The image pickup device according to claim 1, further comprising:
a light shield layer disposed on the charge hold region.

8. The image pickup device according to claim 1, further comprising:
a plurality of microlenses,
wherein a plurality of sets, each including the light receiving region and the charge hold region, are provided to each of the plurality of microlenses.

9. The image pickup device according to claim 1, wherein each of the plurality of pixel circuits includes an amplification transistor electrically connected to the fourth electrode,
a reset transistor configured to supply a reset voltage to the fourth electrode,
a first capacitor including a first terminal and a second terminal, the first terminal being electrically connected to the fourth electrode, and a voltage supplier configured to supply at least a first voltage and a second voltage different from the first voltage to the second terminal, and a voltage supplied to the first electrode and represented by Vs, the first voltage represented by Vd1, the second voltage represented by Vd2, the reset voltage represented by Vres, a capacitance value represented by C1 of the first capacitor, and a capacitance value represented by C2 of a second capacitor formed of the first electrode and the second electrode satisfy a relationship expressed by $$\frac{C1}{C1+C2} > \frac{Vs - Vres}{Vd2 - Vd1}.$$

10. An image pickup system comprising:
the image pickup device according to claim 1; and signal processing device configured to process signals output from the image pickup device.

11. The image pickup device according to claim 1, wherein
the light receiving region includes a portion, an orthogonal projection of the portion onto a surface of the substrate overlapping with an orthogonal projection of the second electrode onto the surface of the substrate,
the light receiving region is configured to accumulate the signal charges in the portion, and
the signal charges accumulated in the portion is transferred to the charge hold region.

12. The image pickup device according to claim 11, further comprising:
a third electrode disposed on the semiconductor layer; and
a fourth electrode disposed between the semiconductor layer and the substrate,
wherein the charge hold region is disposed between the third electrode and the fourth electrode,
the charge hold region includes a portion, an orthogonal projection of the portion onto the surface of the substrate overlapping with an orthogonal projection of the fourth electrode onto the surface of the substrate, and
the signal charges accumulated in the portion of the light receiving region are transferred to the portion of the charge hold region.

13. The image pickup device according to claim 1, wherein the signal charges accumulated in the light receiving region are transferred to the charge hold region without being trapped by the second electrode.

14. An image pickup device comprising:
a substrate which includes source regions and drain regions of transistors included in a plurality of pixel circuits and disposed in the substrate;
a semiconductor layer disposed on the substrate;
a first electrode disposed on the semiconductor layer;
a second electrode disposed between the semiconductor layer and the substrate;
a third electrode disposed on the semiconductor layer;
a fourth electrode disposed between the semiconductor layer and the substrate; and
an interlayer film including a wiring line provided between the second electrode and the substrate,
wherein a continuous portion of the semiconductor layer includes a light receiving region and a charge hold region, the light receiving region is configured to generate and accumulate signal charges, the light receiving region being disposed between the first electrode and the second electrode,
the charge hold region is configured to hold signal charges generated in, accumulated in and transferred from the light receiving region, the charge hold region being disposed at a position different from the light receiving region,
the charge hold region is disposed between the third electrode and the fourth electrode,
each of the plurality of pixel circuits is configured to read a signal based on an electron generated through photoelectric conversion,
when the electron is transferred from the light receiving region to the charge hold region, a voltage supplied to the second electrode and represented by Vp and a voltage supplied to the fourth electrode and represented by Vm satisfy a relationship expressed by Vp<Vm,
the continuous portion of the semiconductor layer includes a transfer region disposed between the light receiving region and the charge hold region,
the image pickup device further comprises a transfer electrode configured to control a potential of the transfer region,
when the electron is accumulated in the light receiving region, the voltage supplied to the second electrode and represented by Vp and a voltage supplied to the transfer electrode and represented by Vt satisfy a relationship expressed by Vp>Vt, and
when the electron is transferred from the light receiving region to the charge hold region, the voltage represented by Vp, the voltage represented by Vt, and the voltage supplied to the fourth electrode and represented by Vm satisfy a relationship expressed by Vp<Vt<Vm.

15. The image pickup device according to claim 14, further comprising:
a first insulating layer disposed between the light receiving region and the second electrode.

16. The image pickup device according to claim 14, further comprising:
a second insulating layer disposed between the charge hold region and the fourth electrode.

17. The image pickup device according to claim 14, wherein the fourth electrode is disposed to surround the second electrode in a plane parallel to a surface of the substrate.

18. The image pickup device according to claim 14, wherein
the continuous portion of the semiconductor layer includes a transfer region disposed between the light receiving region and the charge hold region, and
the image pickup device further comprises a transfer electrode configured to control a potential of the transfer region.

19. The image pickup device according to claim 14, wherein each of the plurality of pixel circuits includes an amplification transistor configured to output a signal based on the charge generated in the light receiving region.

20. The image pickup device according to claim 14, further comprising:
a light shield layer disposed on the charge hold region.

21. The image pickup device according to claim 14, further comprising:

a plurality of microlenses,
wherein a plurality of sets, each including the light receiving region and the charge hold region, are provided to each of the plurality of microlenses.

22. The image pickup device according to claim 14, wherein
each of the plurality of pixel circuits includes an amplification transistor electrically connected to the fourth electrode,
a reset transistor configured to supply a reset voltage to the fourth electrode,
a first capacitor including a first terminal and a second terminal, the first terminal being electrically connected to the fourth electrode, and
a voltage supplier configured to supply at least a first voltage and a second voltage different from the first voltage to the second terminal, and
a voltage supplied to the first electrode and represented by Vs, the first voltage represented by Vd1, the second voltage represented by Vd2, the reset voltage represented by Vres, a capacitance value represented by C1 of the first capacitor, and a capacitance value represented by C2 of a second capacitor formed of the first electrode and the second electrode satisfy a relationship expressed by $$\frac{C1}{C1+C2} > \frac{Vs - Vres}{Vd2 - Vd1}.$$

23. An image pickup system comprising:
the image pickup device according to claim 14; and
a signal processing device configured to process signals output from the image pickup device.

24. The image pickup device according to claim 14, wherein
the light receiving region includes a portion, an orthogonal projection of the portion onto a surface of the substrate overlapping with an orthogonal projection of the second electrode onto the surface of the substrate,
the light receiving region is configured to accumulate the signal charges in the portion, and
the signal charges accumulated in the portion is transferred to the charge hold region.

25. The image pickup device according to claim 24, further comprising:
a third electrode disposed on the semiconductor layer; and
a fourth electrode disposed between the semiconductor layer and the substrate,
wherein the charge hold region is disposed between the third electrode and the fourth electrode,
the charge hold region includes a portion, an orthogonal projection of the portion onto the surface of the substrate overlapping with an orthogonal projection of the fourth electrode onto the surface of the substrate, and
the signal charges accumulated in the portion of the light receiving region are transferred to the portion of the charge hold region.

26. The image pickup device according to claim 14, wherein the signal charges accumulated in the light receiving region are transferred to the charge hold region without being trapped by the second electrode.

27. An image pickup device comprising:
a substrate which includes source regions and drain regions of transistors included in a plurality of pixel circuits and disposed in the substrate;
a semiconductor layer disposed on the substrate and including, for each of the plurality of pixel circuits, a first portion configured to receive light and a second portion shielded from light;
an interlayer film including a wiring line provided between a second electrode and the substrate;
a light shield layer disposed on the second portion and configured to shield the second portion; and
a bias voltage supplier configured to apply a bias voltage to the first portion and the second portion independently of each other,
wherein
the bias voltage supplier includes a first electrode, a second electrode, a third electrode, and a fourth electrode,
the first portion is disposed between the first electrode and the second electrode,
the second portion is disposed between the third electrode and the fourth electrode,
each of the plurality of pixel circuits is configured to read a signal based on a hole generated through photoelectric conversion,
when the hole is transferred from the first portion to the second portion, a voltage supplied to the second electrode and represented by Vp and a voltage supplied to the fourth electrode and represented by Vm satisfy a relationship expressed by Vp>Vm,
a continuous portion of the semiconductor layer includes a transfer region disposed between the first portion and the second portion,
the image pickup device further comprises a transfer electrode configured to control a potential of the transfer region,
when the hole is accumulated in the first portion, the voltage supplied to the second electrode and represented by Vp and a voltage supplied to the transfer electrode and represented by Vt satisfy a relationship expressed by Vp<Vt, and
when the hole is transferred from the first portion to the second portion, the voltage represented by Vp, the voltage represented by Vt, and the voltage supplied to the fourth electrode and represented by Vm satisfy a relationship expressed by Vp>Vt>Vm.

28. The image pickup device according to claim 27, wherein
the first electrode and the third electrode are formed of a continuous conductive layer, and
the second electrode and the fourth electrode are isolated from each other.

29. The image pickup device according to claim 28, wherein
the light shield layer is disposed on the third electrode or between the third electrode and the second portion.

30. The image pickup device according to claim 29, wherein
the light shield layer is formed of metal, and
the conductive layer and the light shield layer are electrically connected to each other.

31. The image pickup device according to claim 27, wherein
the first electrode and the third electrode are isolated from each other, and
the second electrode and the fourth electrode are isolated from each other.

32. The image pickup device according to claim 31, wherein a light transmittance of the first electrode is higher than a light transmittance of the third electrode.

33. The image pickup device according to claim 27, further comprising:
a first insulating layer disposed between the semiconductor layer and the second electrode; and
a second insulating layer disposed between the semiconductor layer and the fourth electrode.

34. The image pickup device according to claim 27, wherein the fourth electrode is disposed to surround the second electrode in a plane parallel to a surface of the substrate.

35. The image pickup device according to claim 27, wherein
a continuous portion of the semiconductor layer includes a transfer region disposed between the first portion and the second portion, and
the image pickup device further comprises a transfer electrode configured to control a potential of the transfer region.

36. The image pickup device according to claim 27, wherein each of the plurality of pixel circuits includes an amplification transistor configured to output a signal based on charges generated in the first portion.

37. The image pickup device according to claim 27, further comprising:
a plurality of microlenses,
wherein a plurality of sets, each including the first portion and the second portion, are provided to each of the plurality of microlenses.

38. The image pickup device according to claim 27, wherein
each of the plurality of pixel circuits includes an amplification transistor electrically connected to the fourth electrode,
a reset transistor configured to supply a reset voltage to the fourth electrode,
a first capacitor including a first terminal and a second terminal, the first terminal being electrically connected to the fourth electrode, and
a voltage supplier configured to supply at least a first voltage and a second voltage different from the first voltage to the second terminal, and
a voltage supplied to the first electrode and represented by Vs, the first voltage represented by Vd1, the second voltage represented by Vd2, the reset voltage represented by Vres, a capacitance value represented by C1 of the first capacitor, and a capacitance value represented by C2 of a second capacitor formed of the first electrode and the second electrode satisfy a relationship expressed by $$\frac{C1}{C1+C2} > \frac{Vs-Vres}{Vd2-Vd1}.$$

39. An image pickup system comprising:
the image pickup device according to claim 27; and
signal processing device configured to process signals output from the image pickup device
a bias voltage supplier configured to apply a bias voltage to the first portion and the second portion independently of each other.

40. An image pickup device comprising:
a substrate which includes source regions and drain regions of transistors included in a plurality of pixel circuits and disposed in the substrate;
a semiconductor layer disposed on the substrate and including, for each of the plurality of pixel circuits, a first portion configured to receive light and a second portion shielded from light;
an interlayer film including a wiring line provided between the second electrode and the substrate,
a light shield layer disposed on the second portion and configured to shield the second portion; and
a bias voltage supplier configured to apply a bias voltage to the first portion and the second portion independently of each other,
wherein
the bias voltage supplier includes a first electrode, a second electrode, a third electrode, and a fourth electrode,
the first portion is disposed between the first electrode and the second electrode,
the second portion is disposed between the third electrode and the fourth electrode, each of the plurality of pixel circuits is configured to read a signal based on an electron generated through photoelectric conversion, and
when the electron is transferred from the first portion to the second portion, a voltage supplied to the second electrode and represented by Vp and a voltage supplied to the fourth electrode and represented by Vm satisfy a relationship expressed by Vp<Vm,
a continuous portion of the semiconductor layer includes a transfer region disposed between the first portion and the second portion,
the image pickup device further comprises a transfer electrode configured to control a potential of the transfer region,
when the electron is accumulated in the first portion, the voltage supplied to the second electrode and represented by Vp and a voltage supplied to the transfer electrode and represented by Vt satisfy a relationship expressed by Vp>Vt, and
when the electron is transferred from the first portion to the second portion, the voltage represented by Vp, the voltage represented by Vt, and the voltage supplied to the fourth electrode and represented by Vm satisfy a relationship expressed by Vp<Vt<Vm.

* * * * *